United States Patent
Youngman et al.

(10) Patent No.: US 7,404,156 B2
(45) Date of Patent: Jul. 22, 2008

(54) LANGUAGE AND TEMPLATES FOR USE IN THE DESIGN OF SEMICONDUCTOR PRODUCTS

(75) Inventors: Todd Jason Youngman, Rochester, MN (US); John Emery Nordman, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 457 days.

(21) Appl. No.: 11/017,017

(22) Filed: Dec. 20, 2004

(65) Prior Publication Data

US 2005/0273737 A1    Dec. 8, 2005

Related U.S. Application Data

(60) Provisional application No. 60/577,356, filed on Jun. 3, 2004, provisional application No. 60/579,922, filed on Jun. 15, 2004.

(51) Int. Cl.
   *G06F 17/50* (2006.01)
(52) U.S. Cl. .......................................................... 716/3
(58) Field of Classification Search ...................... 716/3
   See application file for complete search history.

(56) References Cited

U.S. PATENT DOCUMENTS

| | | | | |
|---|---|---|---|---|
| 5,351,197 A | * | 9/1994 | Upton et al. ................... | 716/10 |
| 5,903,886 A | * | 5/1999 | Heimlich et al. ............... | 706/50 |
| 6,173,388 B1 | * | 1/2001 | Abercrombie et al. ......... | 712/22 |
| 6,292,925 B1 | * | 9/2001 | Dellinger et al. ............... | 716/8 |
| 6,536,014 B1 | | 3/2003 | McClannahan et al. ........ | 716/1 |
| 2003/0163798 A1 | * | 8/2003 | Hwang et al. .................. | 716/16 |

\* cited by examiner

*Primary Examiner*—Jack Chiang
*Assistant Examiner*—Brandon W Bowers
(74) *Attorney, Agent, or Firm*—Westman, Champlin & Kelly, P.A.

(57) ABSTRACT

During the design of semiconductor products which incorporates a user specification and an application set, the application set being a partially manufactured semiconductor platform and its resources, a template engine is disclosed which uses a simplified computer language having a character whereby data used in commands identified by the character need only be input once, either by a user or by files, and that data, after it has been verified to be correct, is automatically allocated to one or more templates used to generate shells for the specification of a final semiconductor product. Data must be correct and compatible with other data before it can be used within the template engine and the generated shells; indeed the template engine cooperates with a plurality of rules and directives to verify the correctness of the data. The template engine may generate one or more of the following shells: an RTL shell, a documentation shell, a timing analysis shell, a synthesis shell, a manufacturing test shell, and/or a floorplan shell.

11 Claims, 17 Drawing Sheets

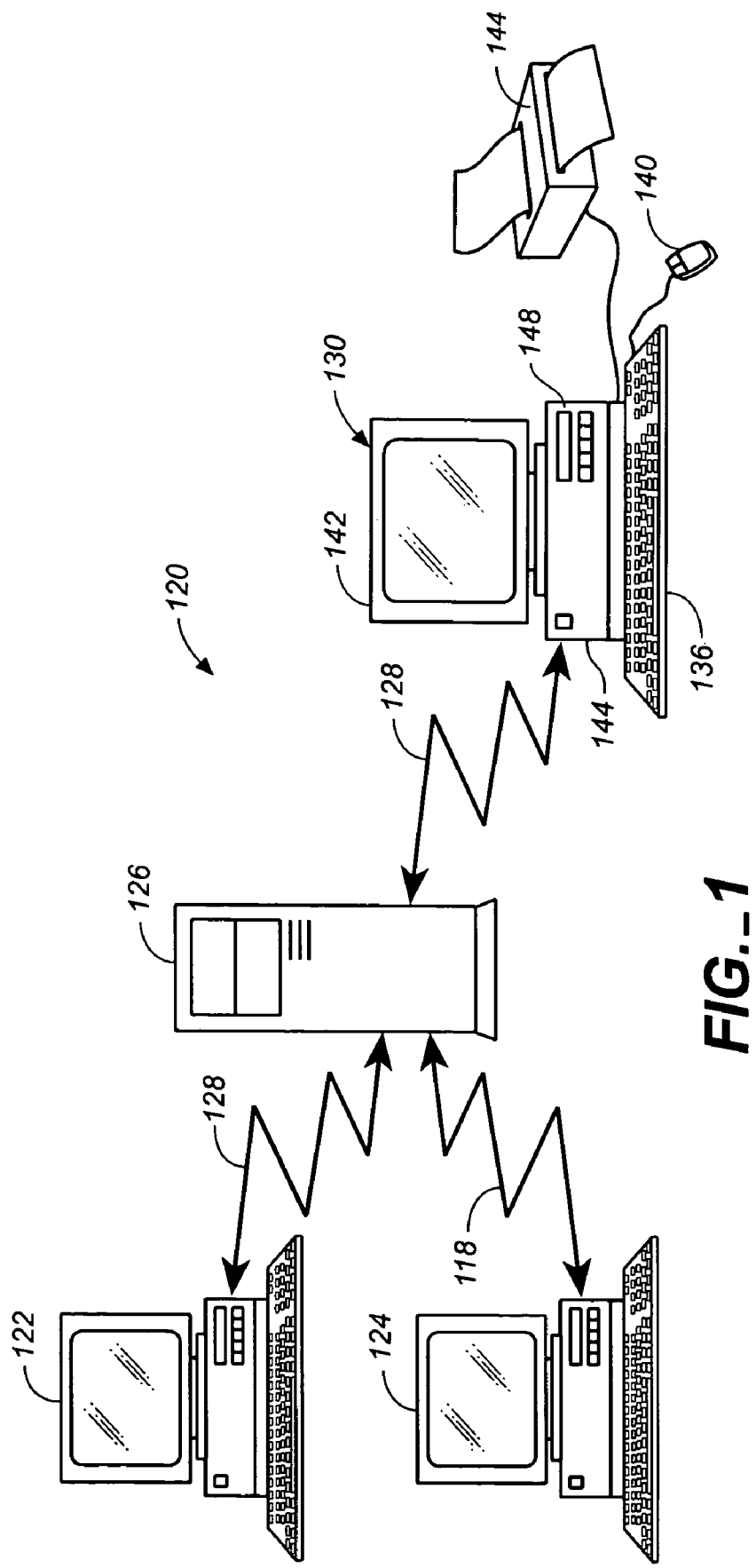
FIG._1

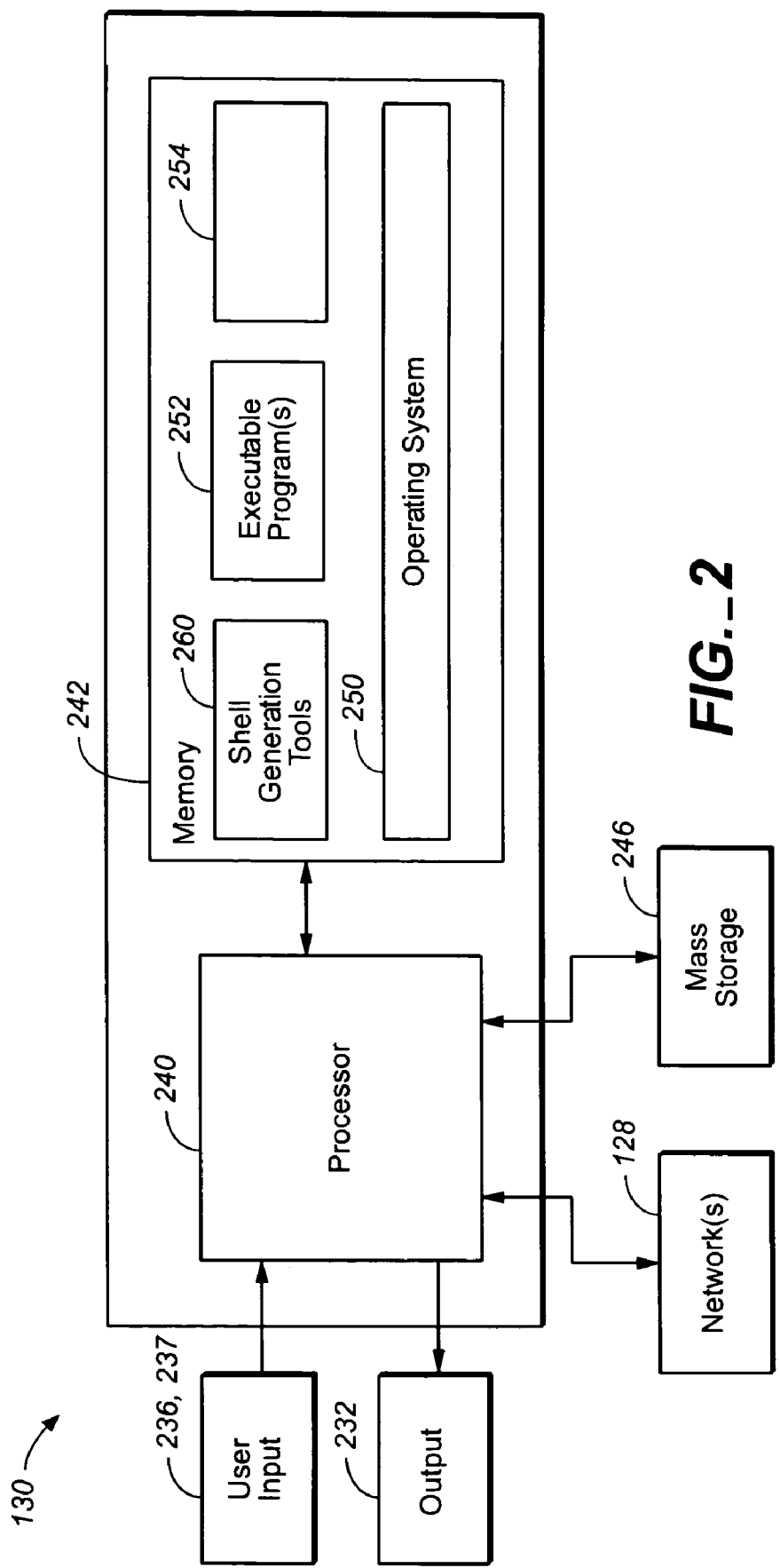
FIG._2

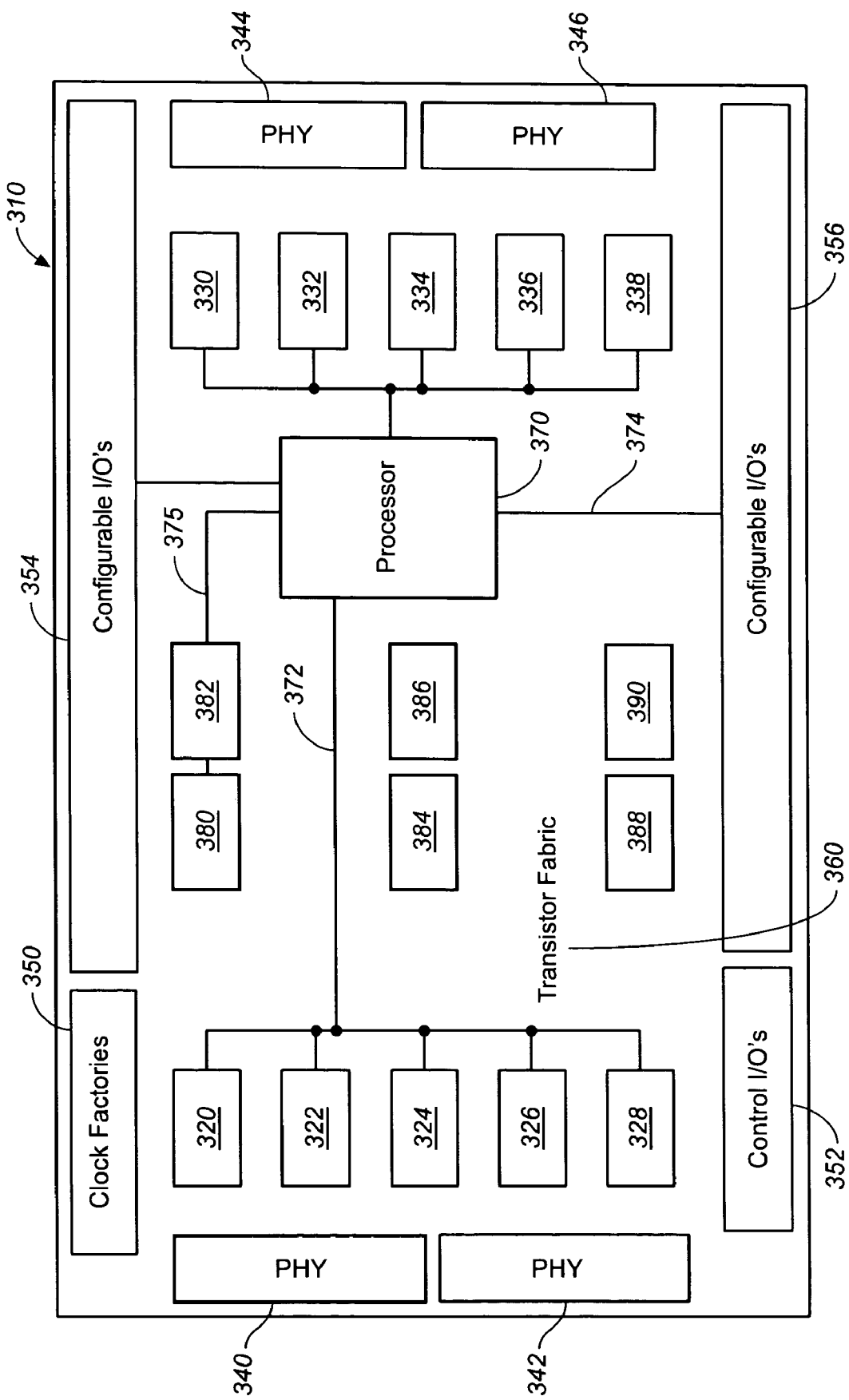
FIG._3

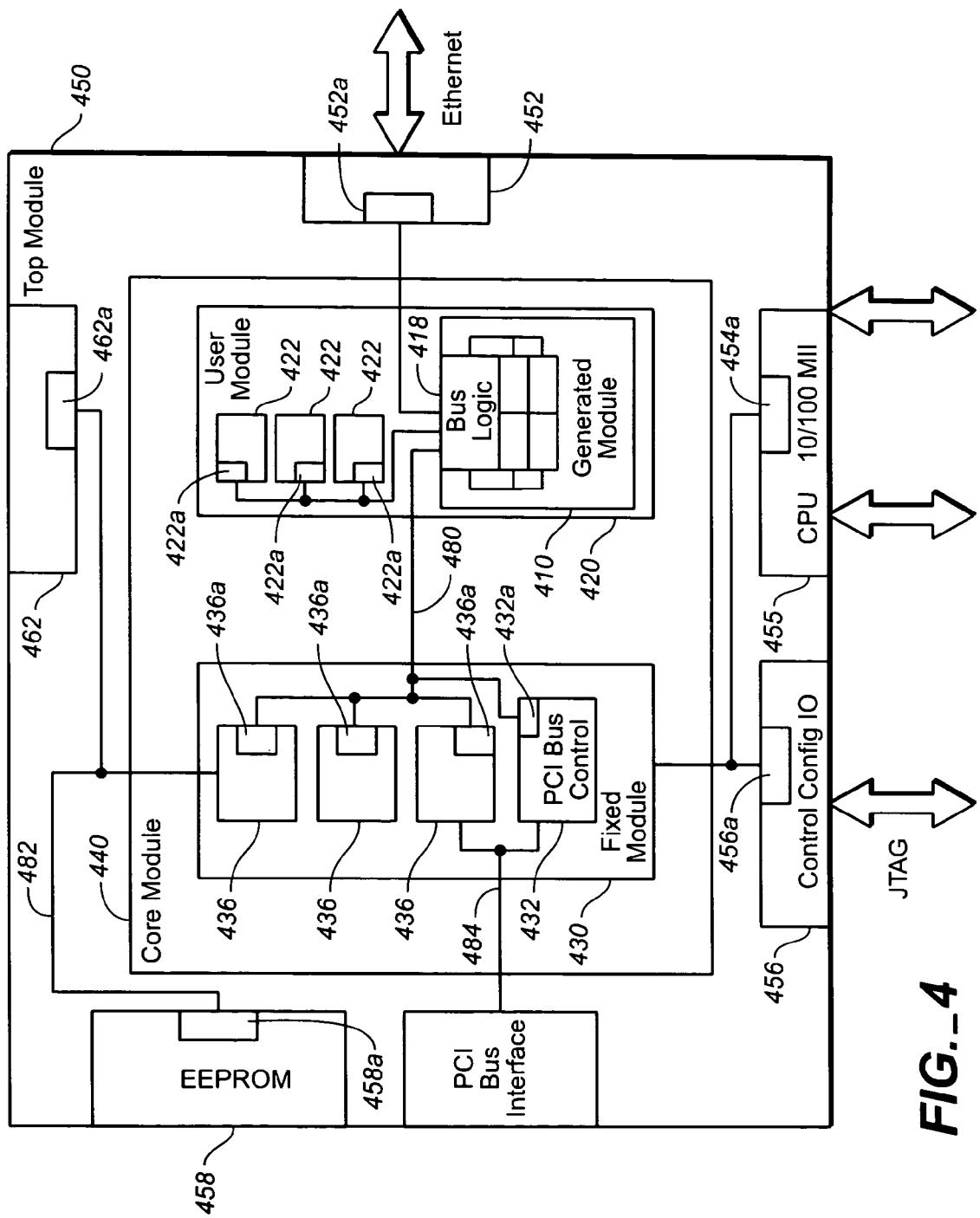
FIG._4

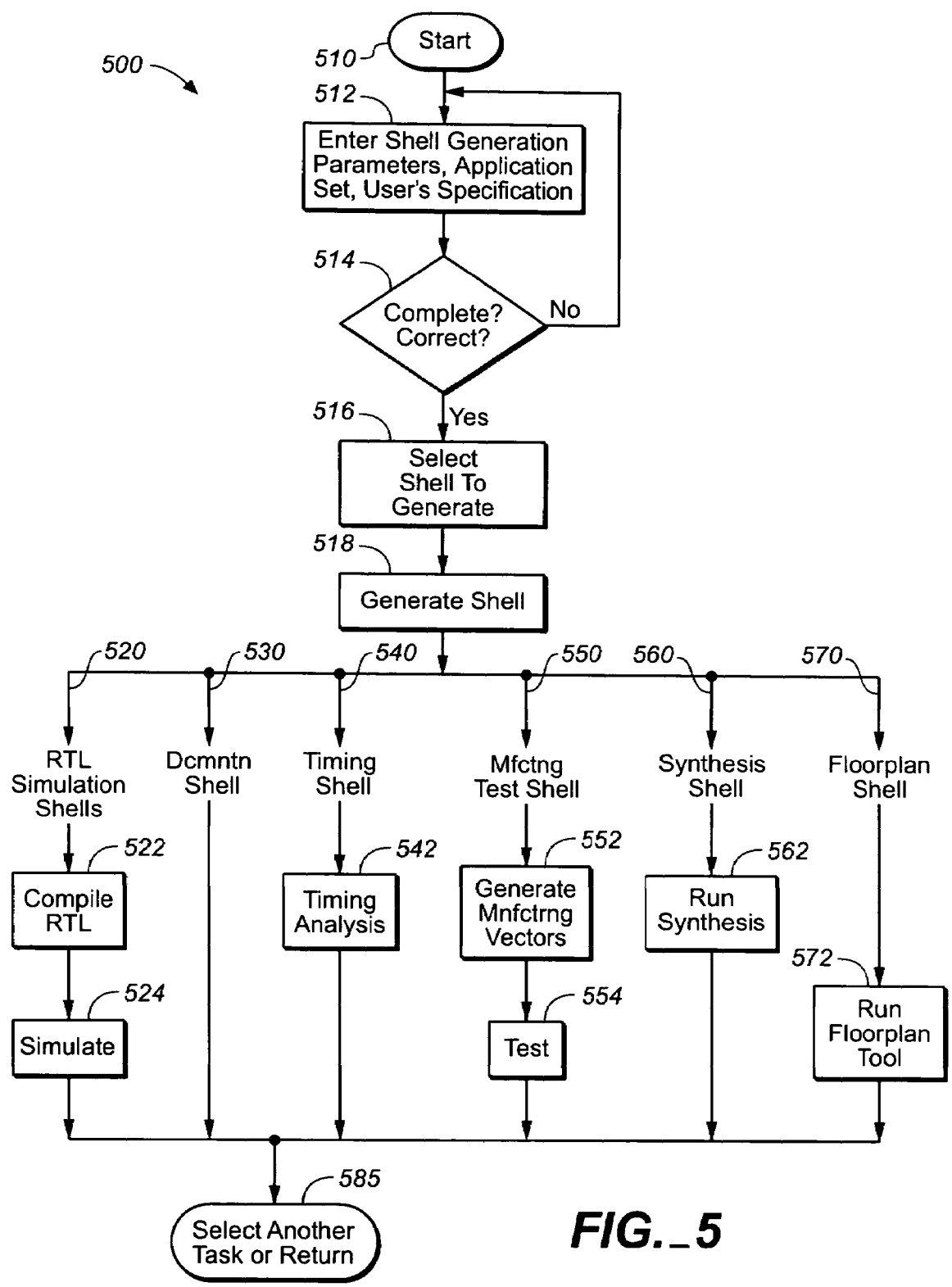
FIG._5

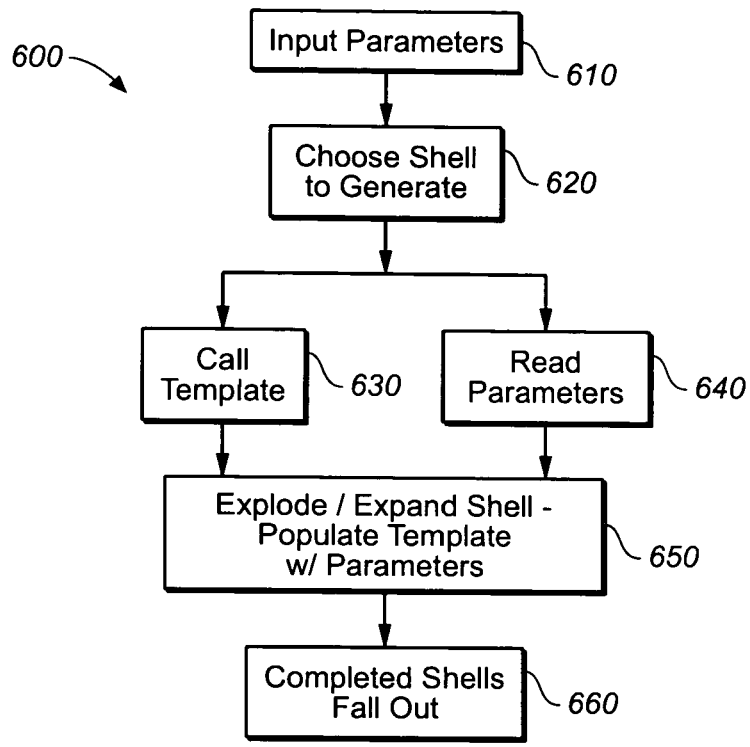
FIG._6
Sample GUI
Design Module  [Timer] — 720
| Signal Name — 730 | Direction — 740 | Description — 750 | Input Delay (ns) — 760 | Output Delay (ns) — 770 | Capacitive Load (pF) — 780 |
|---|---|---|---|---|---|
| 732 Input 1 | 742 In | 752 First Input | 762 10 | 772 ///// | 782 ///// |
| 734 Clock | 744 In | 754 Timer Clock | 764 ///// | 774 ///// | 784 ///// |
| 736 IOA | 746 InOut | 756 Control Port | 766 15 | 776 25 | 786 6 |
| 738 OutputX | 748 Out | 758 Result | 768 ///// | 778 5 | 788 3 |
FIG._7

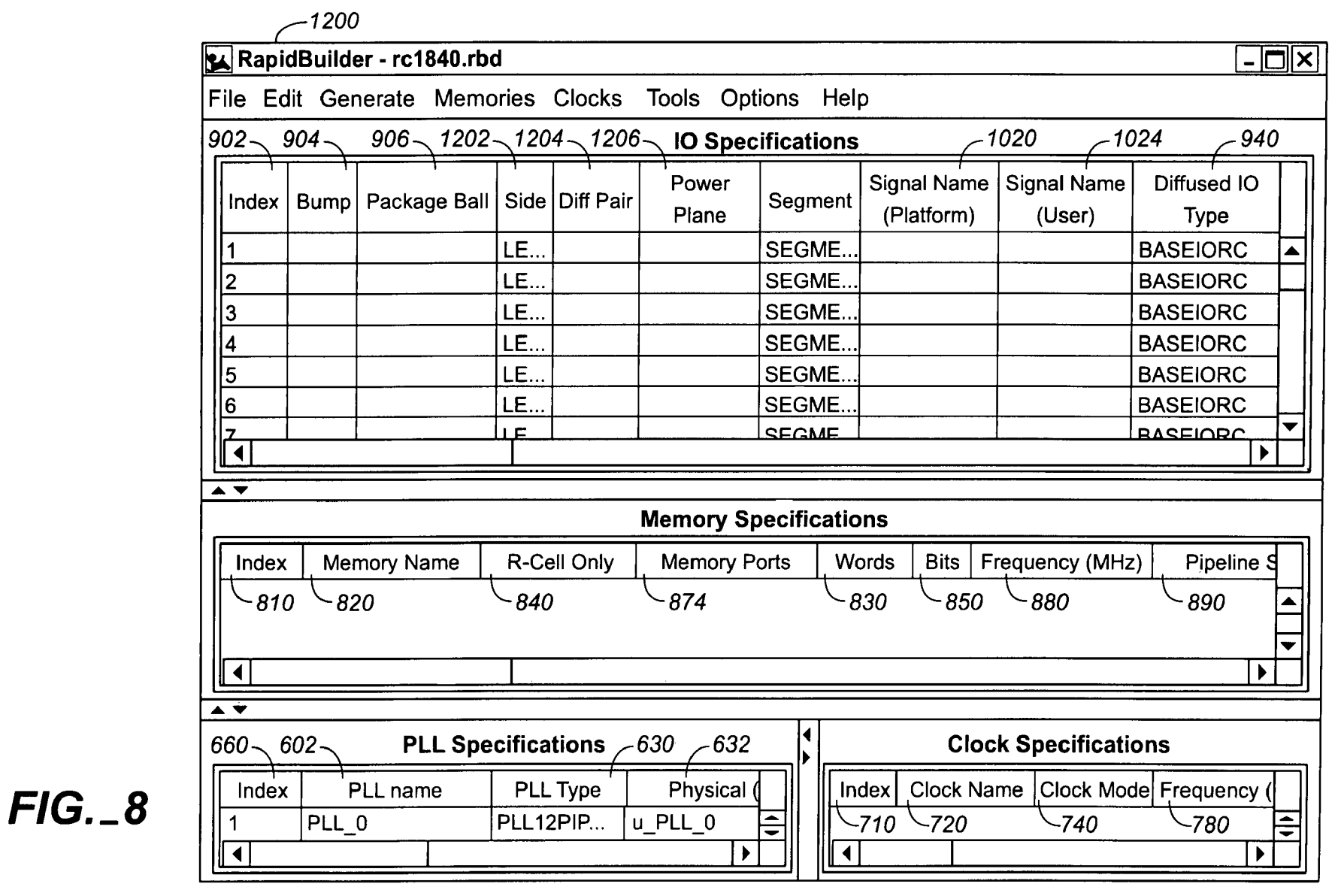

FIG._8

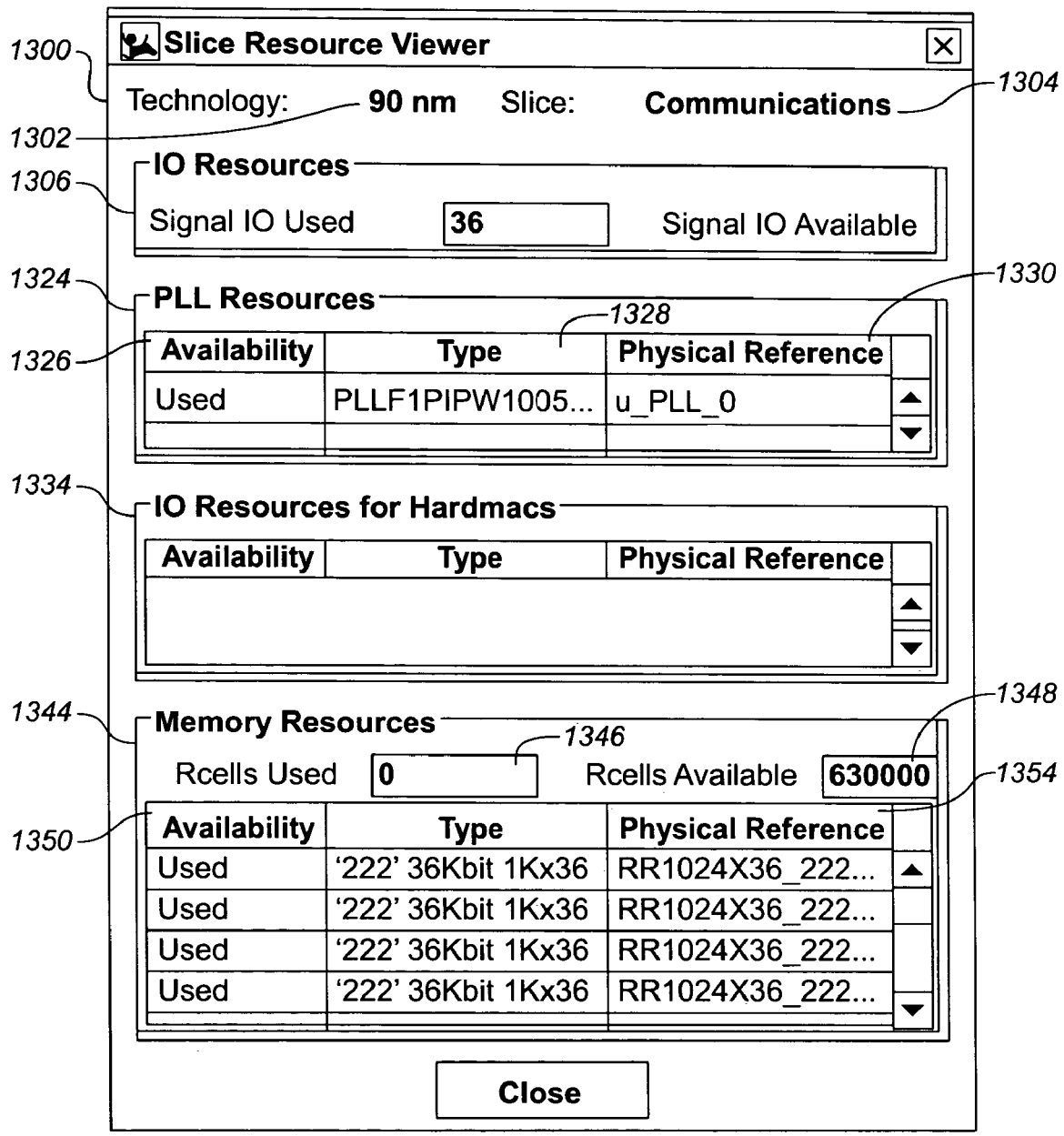
FIG._9

RapidBuilder - rc1840.rbd

File  Edit  Generate  Memories  Clocks  Tools  Options  Help

IO Specifications

| Index | Bump | Package Ball | Side | Diff Pair | Power Plane | Segment | Signal Name (Platform) | Signal Name (User) | Diffused IO Type | IO Direction | VREF or B (Platform) |
|---|---|---|---|---|---|---|---|---|---|---|---|
| 949 | 257 | AF08 | TOP | 256 | SIGNAL01 | SEGMENT49 | BUMP_0257 | BUMP_0257 | BASEIORC | | |
| 950 | 256 | AF09 | TOP | 257 | SIGNAL01 | SEGMENT49 | BUMP_0256 | BUMP_0256 | BASEIORC | | |
| 953 | 168 | AH01 | TOP | 80 | SIGNAL02 | SEGMENT50 | DDR_ADRS[0] | DDR_ADR... | BASEIORC | INOUT | DDR_VRE |
| 955 | 80 | AJ01 | TOP | 168 | SIGNAL02 | SEGMENT50 | DDR_ADRS[1] | DDR_ADR... | BASEIORC | INOUT | DDR_VRE |
| 956 | 212 | AE07 | TOP | 211 | SIGNAL02 | SEGMENT50 | DDR_ADRS[2] | DDR_ADR... | BASEIORC | INOUT | DDR_VRE |
| 957 | 211 | AD07 | TOP | 212 | SIGNAL02 | SEGMENT50 | DDR_ADRS[3] | DDR_ADR... | BASEIORC | INOUT | DDR_VRE |
| 960 | 167 | AE08 | TOP | 79 | SIGNAL02 | SEGMENT50 | DDR_ADRS[4] | DDR_ADR... | BASEIORC | INOUT | DDR_VRE |
| 962 | 79 | AD06 | TOP | 167 | SIGNAL02 | SEGMENT50 | DDR_ADRS[5] | DDR_ADR... | BASEIORC | INOUT | DDR_VRE |
| 963 | 255 | AE09 | TOP | 254 | SIGNAL02 | SEGMENT50 | DDR_ADRS[6] | DDR_ADR... | BASEIORC | INOUT | DDR_VRE |
| 964 | 254 | AD09 | TOP | 255 | SIGNAL02 | SEGMENT50 | DDR_ADRS[7] | DDR_ADR... | BASEIORC | INOUT | DDR_VRE |
| 967 | 166 | AD05 | TOP | 78 | SIGNAL02 | SEGMENT50 | DDR_ADRS[8] | DDR_ADR... | BASEIORC | INOUT | DDR_VRE |
| 969 | 78 | AE05 | TOP | 166 | SIGNAL02 | SEGMENT50 | DDR_ADRS[9] | DDR_ADR... | BASEIORC | INOUT | DDR_VRE |
| 970 | 210 | AE04 | TOP | 209 | SIGNAL02 | SEGMENT50 | DDR_ADRS[... | DDR_ADR... | BASEIORC | INOUT | DDR_VRE |
| 971 | 209 | AD04 | TOP | 210 | SIGNAL02 | SEGMENT50 | DDR_ADRS[... | DDR_ADR... | BASEIORC | INOUT | DDR_VRE |
| 974 | 165 | AE03 | TOP | 77 | SIGNAL02 | SEGMENT50 | DDR_ADRS[... | DDR_ADR... | BASEIORC | INOUT | DDR_VRE |
| 976 | 77 | AD03 | TOP | 165 | SIGNAL02 | SEGMENT50 | DDR_ADRS[... | DDR_ADR... | BASEIORC | INOUT | DDR_VRE |
| 977 | 253 | AE08 | TOP | 252 | SIGNAL02 | SEGMENT50 | DDR_CSn[0] | DDR_CSn[... | BASEIORC | INOUT | DDR_VRE |
| 978 | 252 | AD08 | TOP | 253 | SIGNAL02 | SEGMENT50 | DDR_CSn[1] | DDR_CSn[... | BASEIORC | INOUT | DDR_VRE |
| 981 | 164 | AD02 | TOP | 76 | SIGNAL02 | SEGMENT50 | DDR_CSn[2] | DDR_CSn[... | BASEIORC | INOUT | DDR_VRE |
| 983 | 76 | AE02 | TOP | 164 | SIGNAL02 | SEGMENT50 | DDR_CSn[3] | DDR_CSn[... | BASEIORC | INOUT | DDR_VRE |
| 984 | 208 | AE01 | TOP | 207 | SIGNAL02 | SEGMENT50 | DDR_CSn[4] | DDR_CSn[... | BASEIORC | INOUT | DDR_VRE |
| 985 | 207 | AD01 | TOP | 208 | SIGNAL02 | SEGMENT50 | DDR_CSn[5] | DDR_CSn[... | BASEIORC | INOUT | DDR_VRE |
| 990 | 75 | AB08 | TOP | NO_D... | SIGNAL02 | SEGMENT51 | DDR_VREF_0 | DDR_VRE... | BASEIORC | IN | |
| 991 | 251 | AC09 | TOP | 250 | SIGNAL02 | SEGMENT52 | DDR_CSn[6] | DDR_CSn[... | BASEIORC | INOUT | DDR_VRE |
| 992 | 250 | AB09 | TOP | 251 | SIGNAL02 | SEGMENT52 | DDR_CSn[7] | DDR_CSn[... | BASEIORC | INOUT | DDR_VRE |
| 995 | 162 | AB07 | TOP | 74 | SIGNAL02 | SEGMENT52 | DDR_BA[0] | DDR_BA[0] | BASEIORC | INOUT | DDR_VRE |

FIG._10

RapidBuilder - rc1840.rbd

File  Edit  Generate  Memories  Clocks  Tools  Options  Help

IO Specifications

| Index | Bump | Package Ball | Side | Diff Pair | Power Plane | Segment | Signal Name (Platform) | Signal Name (User) | Di |
|---|---|---|---|---|---|---|---|---|---|
| 959 | 123 | AA05 AA07... | TOP | N/A | POWER02 | SEGMENT50 | vddio25r | vddio25r | BAS |
| 966 | 122 | AA05 AA07... | TOP | N/A | POWER02 | SEGMENT50 | vddio25r | vddio25r | BAS |
| 973 | 121 | AA05 AA07... | TOP | N/A | POWER02 | SEGMENT50 | vddio25r | vddio25r | BAS |
| 980 | 120 | AA05 AA07... | TOP | N/A | POWER02 | SEGMENT50 | vddio25r | vddio25r | BAS |
| 953 | 168 | AH01 | TOP | 80 | SIGNAL02 | SEGMENT50 | DDR_ADRS[0] | DDR_ADRS[0] | BAS |
| 955 | 80 | AJ01 | TOP | 168 | SIGNAL02 | SEGMENT50 | DDR_ADRS[1] | DDR_ADRS[1] | BAS |
| 956 | 212 | AE07 | TOP | 211 | SIGNAL02 | SEGMENT50 | DDR_ADRS[2] | DDR_ADRS[2] | BAS |
| 957 | 211 | AD07 | TOP | 212 | SIGNAL02 | SEGMENT50 | DDR_ADRS[3] | DDR_ADRS[3] | BAS |
| 960 | 167 | AE08 | TOP | 79 | SIGNAL02 | SEGMENT50 | DDR_ADRS[4] | DDR_ADRS[4] | BAS |
| 962 | 79 | AD06 | TOP | 167 | SIGNAL02 | SEGMENT50 | DDR_ADRS[5] | DDR_ADRS[5] | BAS |
| 963 | 255 | AE09 | TOP | 254 | SIGNAL02 | SEGMENT50 | DDR_ADRS[6] | DDR_ADRS[6] | BAS |
| 964 | 254 | AD09 | TOP | 255 | SIGNAL02 | SEGMENT50 | DDR_ADRS[7] | DDR_ADRS[7] | BAS |
| 967 | 166 | AD05 | TOP | 78 | SIGNAL02 | SEGMENT50 | DDR_ADRS[8] | DDR_ADRS[8] | BAS |
| 969 | 78 | AE05 | TOP | 166 | SIGNAL02 | SEGMENT50 | DDR_ADRS[9] | DDR_ADRS[9] | BAS |
| 970 | 210 | AE04 | TOP | 209 | SIGNAL02 | SEGMENT50 | DDR_ADRS[... | DDR_ADRS[10] | BAS |
| 971 | 209 | AD04 | TOP | 210 | SIGNAL02 | SEGMENT50 | DDR_ADRS[... | DDR_ADRS[11] | BAS |
| 974 | 165 | AE03 | TOP | 77 | SIGNAL02 | SEGMENT50 | DDR_ADRS[... | DDR_ADRS[12] | BAS |
| 976 | 77 | AD03 | TOP | 165 | SIGNAL02 | SEGMENT50 | DDR_ADRS[... | DDR_ADRS[13] | BAS |
| 977 | 253 | AE08 | TOP | 252 | SIGNAL02 | SEGMENT50 | DDR_CSn[0] | DDR_CSn[0] | BAS |

FIG._11

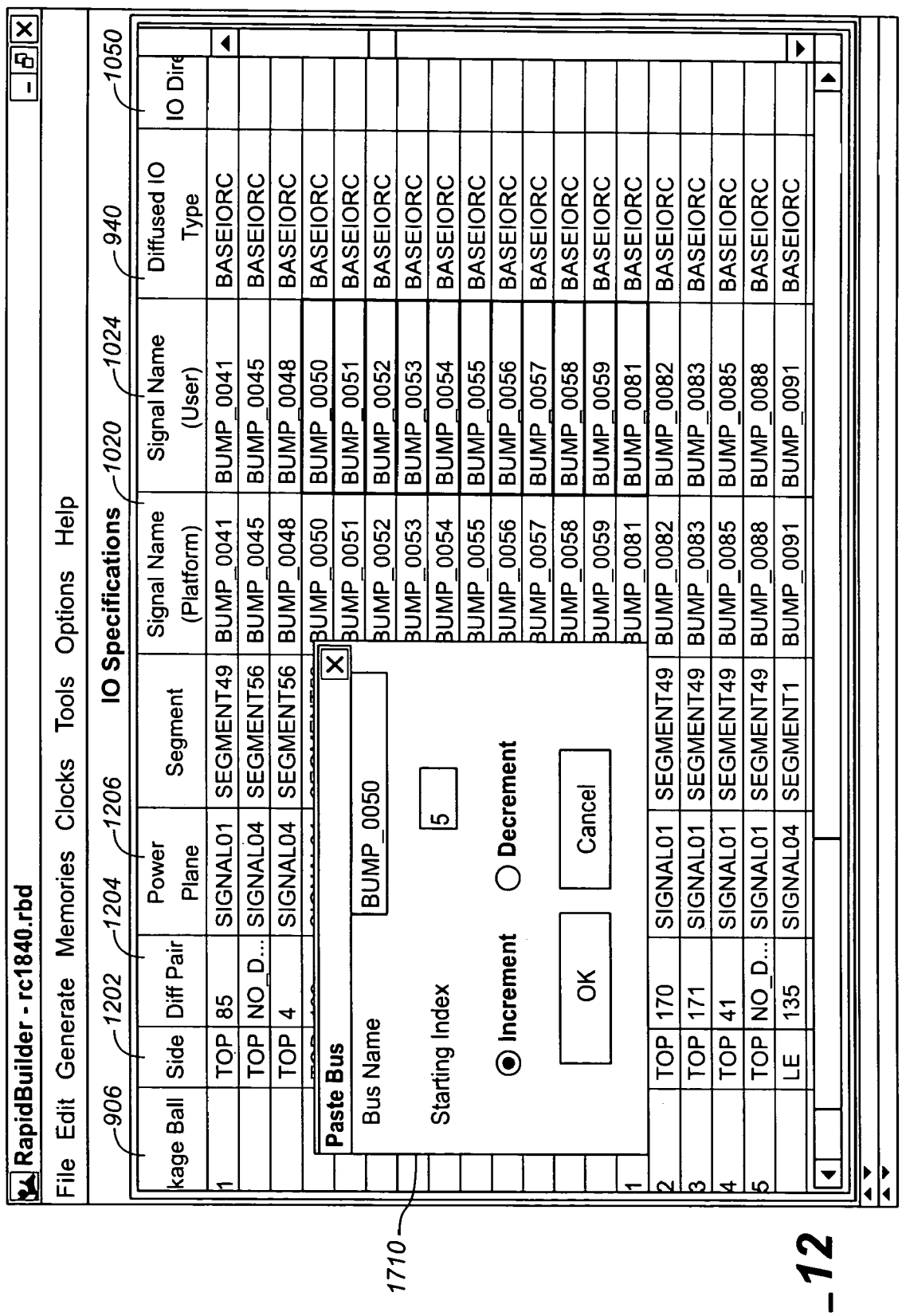
FIG._12

RapidBuilder - rc1840.rbd

File  Edit  Generate  Memories  Clocks  Tools  Options  Help

IO Specifications

| kage Ball | Side | Diff Pair | Power Plane | Segment | Signal Name (Platform) | Signal Name (User) | Diffused IO Type | IO Dire |
|---|---|---|---|---|---|---|---|---|
| | TOP | 86 | SIGNAL01 | SEGMENT49 | BUMP_0041 | BUMP_0041 | BASEIORC | |
| | TOP | NO_D... | SIGNAL04 | SEGMENT56 | BUMP_0045 | BUMP_0045 | BASEIORC | |
| | TOP | 4 | SIGNAL04 | SEGMENT56 | BUMP_0048 | BUMP_0048 | BASEIORC | |
| | TOP | 138 | SIGNAL04 | SEGMENT56 | BUMP_0050 | BUMP_0050[5] | BASEIORC | |
| | TOP | 139 | SIGNAL04 | SEGMENT56 | BUMP_0051 | BUMP_0050[6] | BASEIORC | |
| | TOP | 140 | SIGNAL04 | SEGMENT56 | BUMP_0052 | BUMP_0050[7] | BASEIORC | |
| | TOP | 141 | SIGNAL04 | SEGMENT56 | BUMP_0053 | BUMP_0050[8] | BASEIORC | |
| | TOP | 142 | SIGNAL04 | SEGMENT56 | BUMP_0054 | BUMP_0050[9] | BASEIORC | |
| | TOP | 143 | SIGNAL04 | SEGMENT56 | BUMP_0055 | BUMP_0050[10] | BASEIORC | |
| | TOP | 144 | SIGNAL04 | SEGMENT56 | BUMP_0056 | BUMP_0050[11] | BASEIORC | |
| | TOP | 145 | SIGNAL04 | SEGMENT56 | BUMP_0057 | BUMP_0050[12] | BASEIORC | |
| | TOP | 146 | SIGNAL04 | SEGMENT56 | BUMP_0058 | BUMP_0050[13] | BASEIORC | |
| | TOP | 147 | SIGNAL04 | SEGMENT56 | BUMP_0059 | BUMP_0050[14] | BASEIORC | |
| 1 | TOP | 169 | SIGNAL01 | SEGMENT49 | BUMP_0081 | BUMP_0050[15] | BASEIORC | |
| 2 | TOP | 170 | SIGNAL01 | SEGMENT49 | BUMP_0082 | BUMP_0082 | BASEIORC | |
| 3 | TOP | 171 | SIGNAL01 | SEGMENT49 | BUMP_0083 | BUMP_0083 | BASEIORC | |
| 4 | TOP | 41 | SIGNAL01 | SEGMENT49 | BUMP_0085 | BUMP_0085 | BASEIORC | |
| 5 | TOP | NO_D... | SIGNAL01 | SEGMENT49 | BUMP_0088 | BUMP_0088 | BASEIORC | |
| | LE | 135 | SIGNAL04 | SEGMENT1 | BUMP_0091 | BUMP_0091 | BASEIORC | |

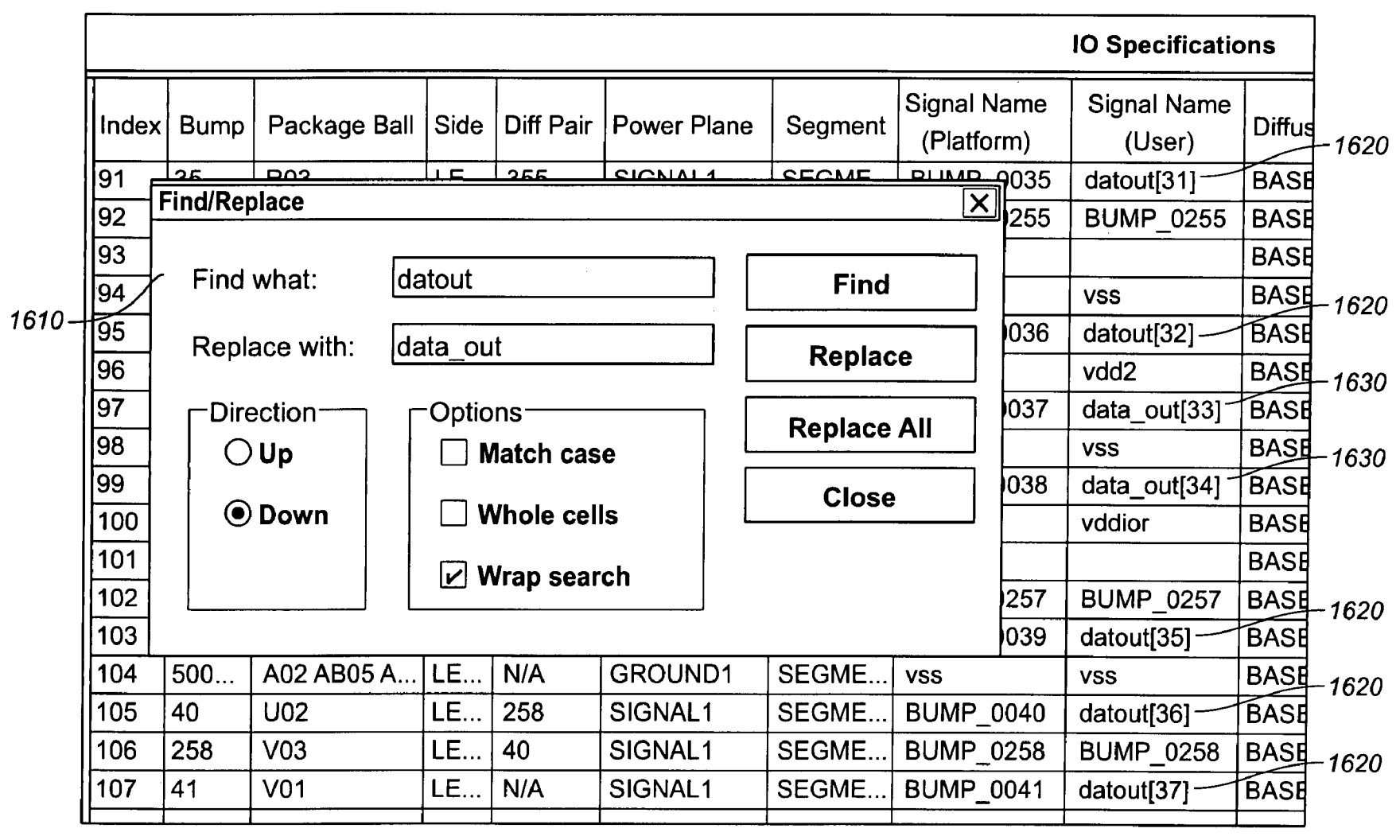

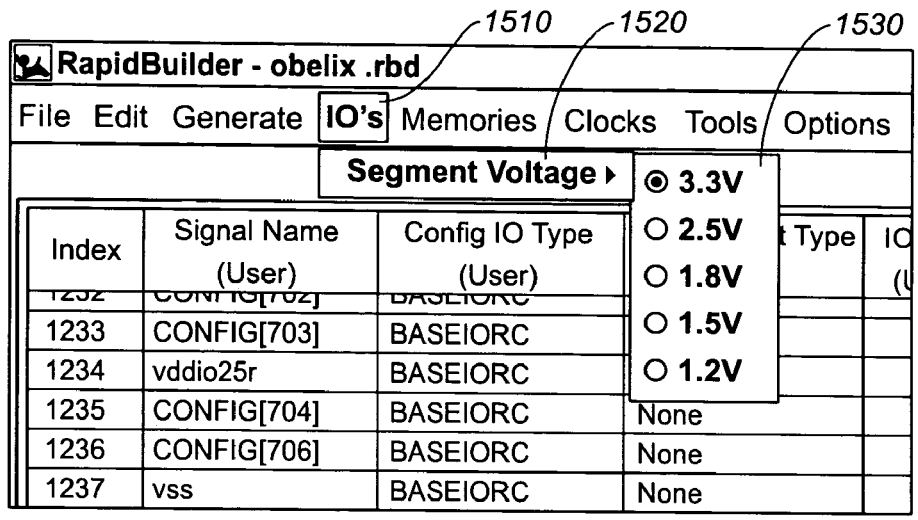
FIG._15
FIG._19

FIG._16

| Index | Signal Name (Platform) | Signal Name (User) | IO USE (Platform) | IO USE (User) | Config IO Type (Platform) | Config IO Type (User) | Component Type (Platform) | Component Type (User) |
|---|---|---|---|---|---|---|---|---|
| 50 | BUMP_0 | BUMP_... | INOUT | INOUT | BD4CLS25... | BD4CLS25... | None | UM |
| 851 | BUMP_0 | BUMP_... | INOUT | INOUT | BD4CLS33... | BD4CULS3... | None | UM |
| 845 | BUMP_0 | BUMP_... | INOUT | INOUT | BD4CLS33... | BD4CULS3... | None | UM |
| 848 | BUMP_0 | BUMP_... | INOUT | INOUT | BD4CLS33... | BD4CLS33... | None | UM |
| 850 | BUMP_0 | BUMP_... | INOUT | INOUT | BD4CLS33... | BD4CLS33... | None | UM |
| 63 | BUMP_0 | BUMP_... | INOUT | INOUT | BD4CLS25... | BD4CLS25... | None | UM |
| 61 | BUMP_0 | BUMP_... | INOUT | INOUT | BD4CLS25... | BD4CLS25... | None | UM |
| 58 | BUMP_0 | BUMP_... | INOUT | INOUT | BD4CLS25... | BD4CLS25... | None | UM |
| UM64 | BUMP_0 | BUMP_... | INOUT | INOUT | BD4CLS33... | BD4CLS33... | None | UM |
| 844 | BUMP_0 | BUMP_... | INOUT | INOUT | BD4CLS25... | BD4CLS25... | None | UM |
| 842 | BUMP_0 | BUMP_... | INOUT | INOUT | BD4CLS25... | BD4CLS25... | None | UM |
| 69 | BUMP_0 | BUMP_... | INOUT | INOUT | BD4CLS25... | BD4CLS25... | None | UM |
| 66 | BUMP_0 | BUMP_... | INOUT | INOUT | BD4CLS25... | BD4CLS25... | None | UM |
| 71 | BUMP_0 | BUMP_... | INOUT | INOUT | BD4CLS25... | BD4CLS25... | None | UM |
| 65 | BUMP_0 | BUMP_... | INOUT | INOUT | BD4CLS25... | BD4CLS25... | None | UM |
| 77 | BUMP_0 | BUMP_... | INOUT | INOUT | BD4CLS25... | BD4CLS25... | None | UM |
| 75 | BUMP_0 | BUMP_... | INOUT | INOUT | BD4CLS25... | BD4CLS25... | None | UM |
| 72 | BUMP_0 | BUMP_... | INOUT | INOUT | BD4CLS25... | BD4CLS25... | None | UM |

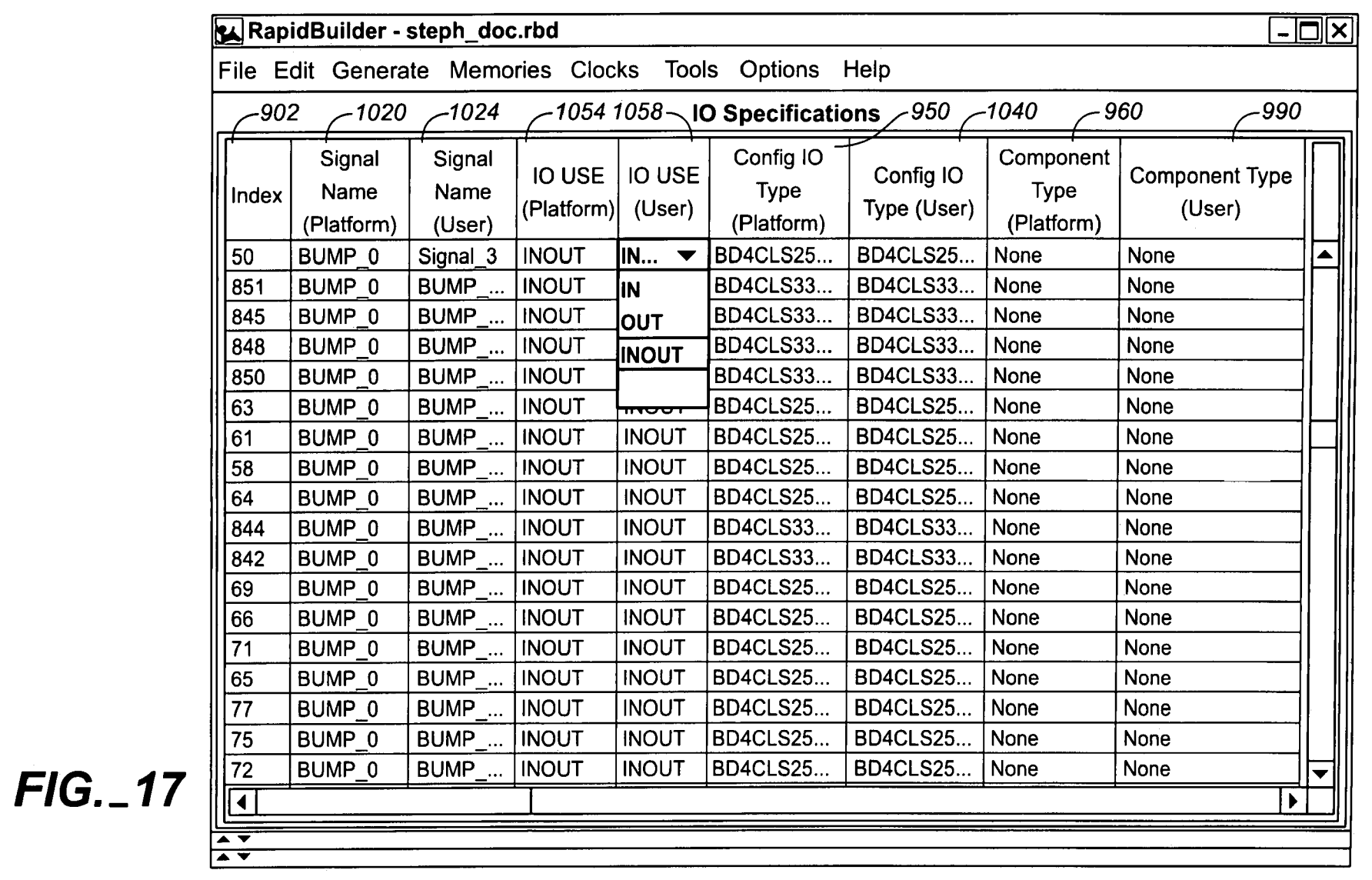

FIG._17

| Index | Signal Name (Platform) 1020 | Signal Name (User) 1024 | IO USE (Platform) 1054 | IO USE (User) 1058 | Config IO Type (Platform) 950 | Config IO Type (User) | Component Type (Platform) 1040 960 | Component Type (User) 990 |
|---|---|---|---|---|---|---|---|---|
| 50 | BUMP_0 | Signal_3 | INOUT | IN | BD4CLS25... | BD4CLS26... | None | UCM |
| 851 | BUMP_0 | Todd_1 | INOUT | OUT | BD4CLS33... | BD4CULS3... | None | UCM |
| 845 | BUMP_0 | John_1 | INOUT | INOUT | BD4CLS33... | BD4CLS33... | None | UCM |
| 848 | BUMP_0 | BUMP_... | INOUT | INOUT | BD4CLS33... | BD4CLS33... | None | None |
| 850 | BUMP_0 | BUMP_... | INOUT | INOUT | BD4CLS25... | BD4CLS33... | None | None |
| 63 | BUMP_0 | BUMP_... | INOUT | INOUT | BD4CLS25... | BD4CLS25... | None | None |
| 61 | BUMP_0 | BUMP_... | INOUT | INOUT | BD4CLS25... | BD4CLS25... | None | None |
| 58 | BUMP_0 | BUMP_... | INOUT | INOUT | BD4CLS33... | BD4CLS25... | None | None |
| 64 | BUMP_0 | BUMP_... | INOUT | INOUT | BD4CLS33... | BD4CLS33... | None | None |
| 844 | BUMP_0 | BUMP_... | INOUT | INOUT | BD4CLS25... | BD4CLS25... | None | None |
| 842 | BUMP_0 | BUMP_... | INOUT | INOUT | BD4CLS25... | BD4CLS25... | None | None |
| 69 | BUMP_0 | BUMP_... | INOUT | INOUT | BD4CLS25... | BD4CLS25... | None | None |
| 66 | BUMP_0 | BUMP_... | INOUT | INOUT | BD4CLS25... | BD4CLS25... | None | None |
| 71 | BUMP_0 | BUMP_... | INOUT | INOUT | BD4CLS25... | BD4CLS25... | None | None |
| 65 | BUMP_0 | BUMP_... | INOUT | INOUT | BD4CLS25... | BD4CLS25... | None | None |
| 77 | BUMP_0 | BUMP_... | INOUT | INOUT | BD4CLS25... | BD4CLS25... | None | None |
| 75 | BUMP_0 | BUMP_... | INOUT | INOUT | BD4CLS25... | BD4CLS25... | None | None |
| 72 | BUMP_0 | BUMP_... | INOUT | INOUT | BD4CLS25... | BD4CLS25... | None | None |

FIG._18

LANGUAGE AND TEMPLATES FOR USE IN THE DESIGN OF SEMICONDUCTOR PRODUCTS

RELATED APPLICATIONS

This application for an invention was disclosed in a prior U.S. Provisional Application Ser. No. 60/577,356 entitled LANGUAGE AND TEMPLATE FOR USE IN THE DESIGN OF SEMICONDUCTOR PRODUCTS filed 03 Jun. 2004, that complies with the requirements of the first paragraph of 35 U.S.C. §112. It also relates to U.S. Patent Application filed on 06 May. 2004 Ser. No. 10/840,534 entitled ASSURING CORRECT DATA ENTRY TO GENERATE SHELLS FOR A SEMICONDUCTOR PLATFORM (hereinafter referred to as CORRECT DATA ENTRY) and to U.S. Provisional Application Ser. No. 60/579,922 filed 15 Jun. 2004 entitled Rules and Directives for Validating Correct Data Used in the Design of Semiconductor Products and U.S. Patent Application No. unknown, LSIL Docket No. 04-0977 (U.S. Express Mailing Label EJ855161335) by the same title, filed concurrently herewith (hereinafter referred to as the RULES ENGINE), all applications owned by the same assignee as this application and all applications of which are incorporated by reference in their entireties.

FIELD OF THE INVENTION

This invention relates generally to the field of electronic circuit design and more particularly relates to a language and its use in templates that optimize the creation of correct shells for a semiconductor platform during the design and development of integrated circuits.

BACKGROUND

An integrated circuit comprises layers of a semiconductor, usually silicon, with specific areas and specific layers having different concentrations of electron and hole carriers and/or insulators. The electrical conductivity of the layers and of the distinct areas within the layers are determined by the concentration of dopants within the area. In turn, these distinct areas interact with one another to form transistors, diodes, and other electronic devices. These specific transistors and other devices may interact with each other by field interactions or by direct electrical interconnections. Openings or windows are created for electrical connections between the layers by a combination of masking, layering, and etching additional materials on top of the wafers. These electrical interconnections may be within the semiconductor or may lie above the semiconductor areas and layers using a complex mesh of conductive layers, usually metal such as platinum, gold, aluminum, tungsten, or copper, fabricated by deposition on the surface and selective removal, leaving the electrical interconnections. Insulative layers, e.g., silicon dioxide, may separate any of these semiconductor or connectivity layers. Depending upon the interconnection topology, transistors perform Boolean logic functions like AND, OR, NOT, NOR and are referred to as gates.

Meanwhile, several types of chips have been developed that take advantage of a modular approach having areas in which the transistors and their respective functions are fixed and other areas in which the transistors and their functions are totally or partially programmable/customizable. The different proportion of fixed to programmable modules in an integrated circuit is limited by factors such as complexity, cost, time, and design constraints. The field programmable gate array (FPGA) refers to a type of logic chip that can be reprogrammed. Because of the programmable features, FPGAs are flexible and modification is almost trivial but, on the other hand, FPGAs are very expensive and have the largest die size. The relative disadvantage of FPGAs, however, is its high cost per function, low speed, and high power consumption. FPGAs are used primarily for prototyping integrated circuit designs but once the design is set, faster hard-wired chips are produced. Programmable gate arrays (PGAs) are also flexible in the number of possible applications that can be achieved but are not quite as flexible as the FPGAs and are more time-consuming to modify and test. An application specific integrated circuit (ASIC) is another type of chip designed for a particular application. ASICs are efficient in use of power compared to FPGAs and are quite inexpensive to manufacture at high volumes. ASICs, however, are very complex to design and prototype because of their speed and quality. Application Specific Standard Products (ASSPs) are hard-wired chips that meet a specific need but this customization is both time-consuming and costly. An example of an ASSP might be a microprocessor in a heart pacemaker.

A digital system can be represented at different levels of abstraction to manage the description and design of complex systems with millions of logic gates, etc. For instance, a circuit diagram or a schematic of interconnected logic gates is a structural representation; a picture of a chip with pins extending from the black box/rectangle is a physical representation; and the behavioral representation, considered the highest level of abstraction, describes a system in terms of what it does, how it behaves, and specifies the relationship between the input and output signals. A behavioral description could be a Boolean expression or a more abstract description such as the data register transfer level logic (RTL). RTL descriptions are specified by the following three components: (1) the set of registers in the system or subsystem, such as a digital module; (2) the operations that are performed on the data stored in the registers; and (3) the control that supervises the sequence of the operations in the system.

Specialized electronic design automation (EDA) software, referred to as tools, intended to implement a more efficient process to design chips has been introduced. Integrated circuits are now designed with the EDA tools using hardware description languages, typically Verilog or VHDL. VHDL stands for VHSIC (Very High Speed Integrated Circuits) Hardware Description Language, the development of which was sponsored by the U.S. Department of Defense and the IEEE in the mid 1980s. VHDL and Verilog are only two hardware description languages but seem to have become the industry's standard languages to describe and simulate complex digital systems and incorporate timing specifications and gate delays, as well as describe the integrated circuit as a system of interconnected components. Execution of programs in hardware description languages are inherently parallel meaning that as soon as a new input arrives the commands corresponding to logic gates are executed in parallel. In this fashion, a VHDL or Verilog program mimics the behavior of a physical, usually digital, system.

In spite of the implementation of EDA tools, chip designers and testers still manually define the specification and address map for individual registers and internal memory, as well as separately and manually specify the implementation at the RTL, the verification testcases, and the firmware header file. Maintaining consistency and manually editing the multitude of minute modifications often required by this out-dated and tedious approach is very difficult and conducive to many mistakes. There is thus a need in the industry for a specialized language usable in a variety of templates by which the specification for an integrated chip can be correctly, comprehensively, and understandably collated.

SUMMARY OF THE INVENTION

These needs and others are thus satisfied by a method of designing a semiconductor product, comprising the steps of reading a plurality of resources available on an application set, the application set comprising a semiconductor platform and its description; reading a user's specification intended to be developed from the application set; allocating at least one resource to the user's specification; accepting and propagating the allocation throughout a plurality of specification tables and at least one shell; and generating the at least one shell and the specification tables. There may be a variety of shells required for the semiconductor product of which at least one shell is an RTL shell and/or a timing shell and/or a documentation shell and/or a manufacturing test shell and/or a synthesis shell and/or a floorplan shell. The method and template engine further determines that one of the plurality of resources cannot be allocated to the user's specification and then can generate an error message; and/or not accept the allocation of the resource to the user's specification.

Some of the plurality of resources and/or the user's specifications pertain to phase locked loops for use in the semiconductor product and its parameters may include name and index; output frequency, feedback divider, and reference frequency; type of PLL; and a physical reference. Some of the plurality of resources and/or the user's specifications pertain to clocks for use in the semiconductor product and the parameters which may pertain to the allocation and propagation of one or more clocks comprise the clock's name and index, and/or its frequency, and/or its type of an oscillator source, and/or a divider, if any, and/or an alternate clock, and/or a reset source name. Some of the plurality of resources and/or the user's specifications pertain to memories for use in the semiconductor product and some of the parameters pertaining to allocation and propagation of one or more memories may include a name and index of each memory, and/or a number of words and a number of bits (depth and width) of each memory, and/or whether the memory is constructed from transistor fabric or is a hardmac resource of the application set, and/or the number of memory ports of each memory, and/or a physical reference of each memory. Some of the plurality of resources and/or the user's specifications pertain to input/output (I/O) components and signals for use in the semiconductor product wherein some of the the plurality of parameters pertaining to allocation and propagation of one or more I/O components and signals comprises a signal name and index, and/or a reference voltage for each I/O signal, and/or a direction and use of each I/O signal, and/or polarity, if any, of the signal, and/or a power plane and location of each I/O signal, and/or type of I/O, and/or use of each I/O signal in testing of the semiconductor product, and/or source and destination and port numbers of each I/O signal.

The invention may also be considered a specific language for use with other hardware description languages, the specific language comprising block commands and simple commands, the commands having a character indicating its use in the template engine.

The invention is a template engine wherein the allocation of the resources to the user's specification for the development of a semiconductor product are verified before the template engine generates the shells. The template engine displays the resources and parameters affecting allocation and allows user to interact to select and allocate resources to the user's specification.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

FIG. 1 is a simplified block diagram of a networked computer system in which language and template of the builder tool of the invention can be implemented.

FIG. 2 is a simplified block diagram of the functional components within a computer workstation to which an integrated circuit developer may access and use the language and template of the builder tool in accordance with an embodiment of the invention.

FIG. 3 is a simplified block diagram of a semiconductor platform having a number of components, the design of each may be considered as generation tasks, having shells that may be generated using the templates and the language of an embodiment of the invention.

FIG. 4 is a simplified diagram illustrating the hierarchy of register transfer level logic of a platform description usable by the template and language of the builder tool in accordance with an embodiment of the invention.

FIG. 5 is a simplified flow chart illustrating how parameters in the language of the invention can be entered correctly and then, using the TEMPLATE ENGINE and the RULES ENGINE, generating correct shells for the design and manufacture of a semiconductor product.

FIG. 6 is a simplified flow chart illustrating how a user can implement the template of the builder tool in accordance with an embodiment of the invention.

FIG. 7 is a sample graphical user interface that might appear when a designer is attempting to design a timer having I/O parameters.

FIG. 8 is a screen shot of one example of how a user may select certain data and certain shells to generate in accordance with an embodiment of the invention.

FIG. 9 is a graphical user interface embodying a description of the resources available on a slice to be designed into a semiconductor product using the templates and the language as described herein.

FIGS. 10 and 11 are screen shots of the graphical user interface of a table of specifications of the I/O highlighting a column to be sorted and the results thereof that can be used by the template and the language as described herein.

FIGS. 12-19 are screen shots of graphical user interfaces illustrating how the user can edit data parameters in a table of specifications.

DESCRIPTION OF THE INVENTION

The present invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough, complete, and will fully convey the scope of the invention to those skilled in the art. Like numbers refer to like elements throughout.

Referring to FIG. 1, which illustrates an exemplary computer system 100 upon which a tool to validate the correctness and use of data during the design of a semiconductor product as disclosed herein, could be installed and/or used. Computer system 120 is illustrated as a networked computer system that includes one or more client computers 122, 124 and 130 such as workstations coupled through a network 128 to a server 126. Server 126 could also be a personal computer, a workstation, a midrange computer, or a mainframe computer. While shown here as a point-to-point connection, computers 122 and 124 need not be coupled to server 126 directly, but may be coupled to yet another network which in turn is connected to server 126. Network 128 represents any type of networked interconnection including but not limited to local-area, wide-area, wireless, and public networks such as the Internet or an Intranet, and any number of routers and hubs connected in between, e.g., a local-area network to a wide-area network to the Internet through a series of routers and/or other servers. Any number of computers and other devices may be networked through network 128, e.g., multiple servers, hand-held devices, etc.

For the purposes of the invention, computer 130 may represent practically any type of computer, computer system, or other programmable electronic device, including a client computer similar to computers 122, 124 of FIG. 1, a server computer, e.g., similar to server 126 of FIG. 1, a portable computer, an embedded controller, a hand-held device, etc. Computer 130 may be coupled in a network 128 as shown in FIG. 1 or may be a stand-alone device. Computer 130 will hereinafter also be referred to as a computer although it should be appreciated that the term "computer" may also include other suitable programmable electronic devices capable of allowing a chip designer to use the TEMPLATE ENGINE.

With reference to FIG. 2 wherein the language and templates used in the correct generation of shells and specification of data throughout the design process for a semiconductor product as disclosed herein is installed as an application called the TEMPLATE ENGINE on computer 130. Computer 130 typically receives a number of inputs and outputs for communicating information externally. For interface with a user or operator, computer 130 typically includes one or more user input devices 236, 237, e.g., a keyboard 136 and/or mouse 140 of FIG. 1, a trackball, a joystick, a touchpad, and/or a microphone, among others, and one or more output devices 232 such as a display 142 and/or a printer 144 of FIG. 1, a speaker, among others. Some servers, however, do not support direct user input and output. For additional storage, computer 130 may also include one or more storage devices 148 of FIG. 1, e.g., a floppy or other removable disk drive, a hard disk drive, a direct access storage device, an optical drive, e.g., a CD drive, a DVD drive, etc., and/or a tape drive, among others, that may be connected directly or other storage 246 that may be connected through a storage area network (SAN) or other network 128. Furthermore, computer 130 may include an interface connected to one or more networks 128, e.g., a local-area network, a wide-area network, a wireless network, and/or the Internet, among others, to permit communication of information with other computers 122, 124 coupled to the network 128. It should be appreciated that computer 130 typically includes suitable analog or digital interfaces between processor 240 and each of the components as is known in the art.

Computer 130 typically includes at least one processor 240 coupled to a memory 242. Processor 240 may represent one or more processors or microprocessors and memory 242 may represent the random access memory (RAM) devices comprising the main storage of computer 130, as well as any supplemental levels of memory such as cache memories, nonvolatile or backup memories, programmable or flash memories, read-only memories, etc. In addition, memory 242 may be considered to include memory storage physically located elsewhere in computer 130, e.g., any storage capacity used as a virtual memory, e.g., as stored on a mass storage device 246 coupled to computer 130 with a SAN or on another computer coupled to computer 130 via network 128.

Computer 130 may operate under the control of an operating system 250 such as a UNIX-based, LINUX-based, or WINDOWS-based operating system, as is known in the art, but is not so limited by the particular operating system, or indeed need not be under the control of any operating system. Operating system 250 typically executes various computer software applications, components, programs, objects, modules, etc., such as an executable program 252, etc. Although the tools and libraries 260 for developing an integrated circuit may be in memory 242, they need not be. The processor 240 may access the tools and libraries 260, the required data, other various applications components, programs, objects, modules, etc., resident on one or more processors in another computer coupled to computer 130 via a network 128, e.g., in a distributed or client-server computing environment whereby the processing to implement the functions of the correct shell generation tool may be allocated to multiple computers over a network.

In general, the program or method steps which cause a computer to insert correct data into a variety of templates corresponding to shells during the design of a semiconductor product, whether implemented as part of an operating system or a specific application, component, program, object, module, or sequence of instructions, will be referred to herein as the TEMPLATE ENGINE. The TEMPLATE ENGINE typically comprises one or more instructions that are resident at various times in various memory and storage devices in a computer, and that, when read and executed by one or more processors in a computer network, cause that computer to perform the steps necessary to execute steps or elements embodying the various aspects of the invention. While the invention has and hereinafter will be described in the context of fully functioning computers and computer systems, those skilled in the art will appreciate that the various embodiments of the invention are capable of being distributed as a program product in a variety of forms and that the invention applies equally regardless of the particular type of signal bearing media used to actually carry out the distribution. Computer program code for carrying out operations of the present invention may execute entirely on the user's computer, partly on the user's computer, as a stand-alone software package, partly on the user's computer and partly on a remote computer or entirely on the remote computer. In the latter scenario, the remote computer may be connected to the user s computer through a network 128, for example, the Internet using an Internet Service Provider. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links.

One input to the TEMPLATE ENGINE is the application set. An application set is, inter alia, a description of the platform and several shells that make the platform useful to a chip designer. Viewing FIG. 3, a platform 310 is a partially manufactured semiconductor device in which the wafer layers up to the connectivity layers have been fabricated. The platform 310 comprises a base semiconductor wafer from, e.g., silicon, silicon-on-insulator, silicon germanium, gallium arsenide, other Type II, IIII, IV, and V semiconductors, etc. and is a piece of semiconductor material into which blocks or hardmacs have been diffused into the semiconductor layers. Diffusing a semiconductor wafer to create a hardmac simply means that during fabrication of the wafer layers, transistors or other electronic devices have been particularly arranged in the wafer layers to achieve specific functions, such as diffused memory 320-328, 330-338, data transceiver hardware such as I/O PHYs 340-346, clock factories including phase-locked loops (PLLs) 350, control I/Os 352, configurable input/output (I/O) hardmacs 354, 356; each of the hardmacs having an optimum arrangement and density of transistors to realize its particular function. The platform further comprises an area of transistor fabric 360 for further development of the platform 310 using a suite of generation tools, each of which may incorporate the template as described herein. Transistor fabric 360 is an array of prediffused transistors in a regular pattern that can be logically configured by the suite of generation tools herein to achieve different functions. A cell refers to the personalization of the interconnect layers that instantiate the logic gates of the transistor fabric. A memory compiler (not shown) may have compiled some blocks of diffused memory 320-338 for specific sizes, timing requirements, connections, etc. The placement of these hardmacs, compiled memories, and the reserved areas of the transistor fabric 360 have been situated to achieve the desired timing and performance both within the platform and for the platform 310 to connect externally.

One of skill in the art will appreciate that the platform 310 shown in FIG. 3 is only one example of a platform and its components. Different platforms may contain different amounts and arrangements of transistor fabric, different amounts of diffused and/or compiled memories, both fixed and configurable I/O blocks, clocks, etc. depending upon the purpose of the final integrated chip. For instance, if the final chip is intended to be a communication and/or network integrated circuit, the periphery of the platform may contain many I/O hardmacs that have been fixed as PHYs and/or that can be configured differently from one another. Likewise, if the final integrated chip is intended to be a specialized microprocessor then it may not have as many I/O hardmacs or configurable I/O, and more or less diffused registers and memories. The point is that there are different platforms for different semiconductor products. The platform 310, moreover, optionally may include the contact mask and some of the fixed higher layers of connectivity for distribution of power, ground, and external signal I/O.

The platform definition is a detailed listing of the physical resources features available on the platform, such as the area and availability of transistor fabric, the I/O and memory available, the requirements of the hardmacs, the cost of the platform, the ideal performance that can be expected of the platform, the expected power consumption, and other functional requirements. For memory elements, the platform definition may include, inter alia, details of: (a) area and physical placement of the memory array and its interface/connection pins; (b) bit width and depth; (c) organization, e.g., numbers of read/write ports, bit masking; (d) cycle time; and (e) power estimates. For I/O elements, the platform definition may provide, inter alia, the types of I/O, the I/O drive strength, etc. For clock elements, the platform definition provides the frequencies at which the platform may operate, the duty cycle, etc. Other details of the platform definition may include the configuration of the transistor fabric and the diffused and compiled elements, the status of the logic, the required control signals and the features enabled by the control signals, whether any element undergoes testing, the location and the number of the elements on the platform, etc.

The platform and its definition are of little use to a designer needing to develop a functional integrated circuit, so several representations of the diffused resources of the platform are needed; shells are these representations. Shells are the logic and other infrastructure that makes the platform useful as a design entity, and the TEMPLATE ENGINE described herein is preferably used to generate these shells. The platform description, i.e., the application set, constrains all other generated parameters and other user input to make the platform useful to design a semiconductor product. Using the TEMPLATE ENGINE, the RULES ENGINE, the CORRECT DATA ENTRY, and a suite of other generation tools, a chip designer can integrate her/his customer's requirements with the platform's resources and definition to verify and synthesize designs generated by each tool, insert clocks, create the test interconnects, and then integrate the designs together to create a complete design. The resultant design, moreover, is a qualified netlist with appropriate placement and routing amongst the existing resources and for external connections to a board. To create a customized chip, all that is needed is a small set of remaining masks to create the interconnections between the preplaced elements.

There are a number of shells used by a designer to integrate her/his customer's requirements using a particular platform description, and depending upon the designer's particular task; one or more of these shells can be used. While the following description is not intended to be limitative, it is nonetheless, fairly representative of the infrastructure necessary to use the platform and create a functional semiconductor product from the platform. These shells comprise: the RTL shells, the documentation shell, the verification shell, the synthesis shell, the static timing analysis shell, the manufacturing test shell, the floorplan shell, and the RTL qualification shell. The RTL shell provides a logical description of the platform, and the generated or user resources. The documentation shell may be considered the functional description of the resources. The verification shell is the functional verification description, and the synthesis shell may be thought of as the generation description. The static timing analysis shell is the timing description, the manufacturing test shell is the test description, and the floorplan shell is a location description of the platform resources.

An additional perspective of these shells may be obtained by abstracting the semiconductor product as modules based upon the source of the RTL and the function of the logic, such as shown in FIG. 4. One of skill in the art will understand that these shells are not necessarily generated according to this or any other abstraction; that is to say, a generated verification shell or any other shell may have aspects in one or more of these modules and that the shells are not necessarily generated in the order of or limited to the following modules. The information is presented to show the complexity and the interconnectedness of the shells with each other and with the modules throughout the semiconductor platform. The generated module 410 preferably comprises the shells generated by a suite of generation tools for I/O, memory, clocks, or may be derived from other known semiconductor design tools such as described in copending United States patent applications, commonly owned by the assignee herein and hereby incorporated by reference in their entireties: Ser. No. 10/435,168 filed 08 May 2003 entitled AUTOMATION OF THE DEVELOPMENT, TESTING, AND RELEASE OF A FLOW FRAME WORK AND METHODOLOGY TO DESIGN INTEGRATED CIRCUITS; Ser. No. 10/318,792 filed 13 Dec. 2002 entitled FLEXIBLE TEMPLATE HAVING EMBEDDED GATE ARRAY AND COMPOSABLE MEMORY FOR INTEGRATED CIRCUITS; Serial No. 10/318,623 filed 13 Dec. 2002 entitled AUTOMATED SELECTION AND PLACEMENT OF MEMORY DURING DESIGN OF AN INTEGRATED CIRCUIT; Ser. No. 10/334,568 filed 31 Dec. 2002 entitled PLACEMENT OF CONFIGURABLE INPUT/OUTPUT BUFFER STRUCTURES DURING DESIGN OF INTEGRATED CIRCUITS; Ser. No.

10/335,360 filed 31 Dec. 2002 entitled A SIMPLIFIED PROCESS TO DESIGN INTEGRATED CIRCUITS; Ser. No. 10/465,186 filed 19 Jun. 2003 entitled DESIGNING AND TESTING THE INTERCONNECTION OF ADDRESSABLE DEVICES OF INTEGRATED CIRCUITS; and Ser. No. 10/713,492 filed 14 Nov. 2003 entitled FLEXIBLE DESIGN FOR MEMORY USE IN INTEGRATED CIRCUITS. The generated module 410 may include some preplaced, timed, and proven components, such as one or more clock generators, system controllers and reset logic, test controllers, and/or analog serializers/deserializers (SERDES) hardmac components. The generated module 410 has connectivity requirements to the various modules and their components through bus logic 418 along an internal bus 480 and/or external bus 482. Bus logic 418 may include arbiters, multiplexers, decoders, etc. to manage the connectivity and, if necessary, the address translation and register/memory coherence schemes.

Surrounding the generated module 410 is the user module 420. Logic from the customer for whom the integrated circuit is designed comprises the user module 420 and may include prefabricated logic and hardware such as cores, hardmacs, IOs, registers 422, etc. Also included in the user module 420 may be a list of memories and/or registers having tie-offs, i.e., the memories and/or registers that will not be used for data flow and may thus be allocatable for performance enhancing features such as control status registers, etc. The user module 420 also provides input into the TEMPLATE ENGINE described herein.

The fixed module 430 is created with the application set and thus encompasses the fixed resources and the shells pertaining to these fixed resources of the application set. The fixed module 430 and its accompanying shells provide the basic input to the TEMPLATE ENGINE upon which the customer's requirements will be built. The fixed module 430 may be as simple as logic signals directly connected to external chip I/Os, or it may be more complex logic upon which the user module 420 and the generated module 410 can build. For example, shells of the fixed module 430 could include the complete infrastructure to support a PCI bus controller 432, 432a including all the connections to external I/Os and/or a DDR/SRAM memory controller, a processor subsystem 436, 436a, etc. The TEMPLATE ENGINE herein accepts the shells of the fixed module 430 and then further facilitates matching and binding the memories, register blocks, any cores 436 in the fixed module to the top module 450, such as matching protocols and correctly binding the correct I/O hardmacs PHYs 452, such as an XGXS to support data transfer at Gigabit Ethernet speeds, or a MW SPI-4 core.

The core module 440 encompasses the fixed module 430 and the user module 420 and may be described as the correct and proven logic interfaces connecting them with each other and with the top module 450. The top module 450 contains the logic and supporting shells for the hardmacs and configured logic towards the periphery of the platform for outside communication. The top module 450 thus contains the I/O blocks and I/O diffused areas and any registers associated with the hardmac and configurable I/Os. The instantiated I/O blocks that use the top module 450 may include the PLLs, the I/O netlists of which a NAND tree is a part, test logic, and lock detect circuits, etc. A number of input tables of the TEMPLATE ENGINE integrate the bus masters of 452a 454a, 456a, 458a, 462a of their respective top module components 552, 554, 556, 558, 562 with the application set and the rest of the design. These top module components may include a JTAG TAP controller 456, an Ethernet interface 452, a CPU connection interface 454, and/or an EEPROM interface 458, etc., each of which may require special consideration when inputting associated parameters.

FIG. 5 is a simplified flow chart of a method 500 of generating correct shells for the platform and modules described in FIGS. 3 and 4. In FIG. 5, the process 500 begins at step 510 whereby the application set and user requirements of the user module and its shells are automatically input to the TEMPLATE ENGINE. At step 512, the TEMPLATE ENGINE reads the parameters of the application set and/or the user's specification that will be used to generate a shell(s), for example, the names of signals, names of inputs/outputs, etc. At this time the input parameters of the shells are checked to ensure their correctness and completeness at step 514, preferably by the CORRECT DATA ENTRY and the RULES ENGINE. If the input parameters are not correct, then the process immediately loops back to step 512 giving the user an opportunity to enter correct shell parameters. If, however, the parameters for the shell are correct, the user selects a shell, such as an RTL, simulation, documentation shell, to generate at step 516. At step 518, the shell(s) is/are automatically generated e.g. by the exploding a template by the TEMPLATE ENGINE, such as described herein. After the shell is generated, then different paths of FIG. 5 are taken depending upon the particular shell. For instance, if the correctly generated shell is an RTL and/or simulation shell, then at step 522, the RTL is compiled. Note, that at this time, the RTL language and syntax will be correct and need not be checked. Then, the RTL is then simulated as in step 524 to determine how the actual signals will transfer from register to register, and the process returns at step 585. After generation of the correct documentation shell 530, the process returns. The correct timing shell 540 will undergo timing analysis at 542 and return. The correct manufacturing test shell 550 generated by the tool as described herein can be used to generate manufacturing vectors at step 552 which will be tested at step 554. The correct synthesis shell 560 will be run at step 562, and the correct floorplan shell 570 will generate a floorplan as in step 572.

FIG. 6 is a simplified flow chart of a method 600 of using the TEMPLATE ENGINE described herein to generate correct shells for the modules described in FIG. 4 and the platform of FIG. 3. In FIG. 6, the process 600 begins at step 610 whereby it is presumed that correct data has been entered into the builder tool database, preferably by the methods outlined in CORRECT DATA ENTRY. In step 620, the user selects a shell, such as an RTL, simulation, documentation shell, to generate. Step 630 calls the appropriate template for the selected shell, and step 640 retrieves the data. Steps 630 and 640 may proceed either simultaneously as illustrated or separated in time. In any event, at step 650, the template is populated with the parameters for the template, often referred to as expanding or exploding the template by the TEMPLATE ENGINE. Then at step 660, the finished shell is generated and made available to the user.

The language of the TEMPLATE ENGINE itself used to input the parameters and to create the shell is defined as below. The language and the embodied templates generate instantiated and formatted shells used in the creation, the design, and the manufacture of semiconductor products. Data is obtained from a data base whose input records were preferably correct upon entry using either enumerated lists or input checking, such as described in CORRECT DATA ENTRY. The syntax of the language and the templates specifically address structures common to both hardware design languages and hardware documentation used in semiconductor integrated circuit design. The language is specifically intended not to be a general-purpose high-level language; in fact, any attempt to make the language and the templates modifiable for general purposes defeats the intent of this specialized language and templates. The simplified language and its use in the templates provide a short, intuitive, and easy-to-learn syntax to allow hardware designers to generate tool templates quickly, without requiring extensive software knowledge.

The form of the template used by the TEMPLATE ENGINE is meant to look as much as possible like the output produced, i.e., wysiwyg. As an example, the original template spacing and tab-stops will be maintained automatically wherever possible to avoid the distraction of formatting commands. Template commands that are interspersed in the text will control how the template is expanded. All template commands begin with the '%' character. If the template requires a literal '%' it must be "escaped" with another '%' character. Commands are of two primary types: block commands and simple commands. Block commands operate on blocks of lines within a template and have a begin-block and end-block delimiter. In our example of the language and syntax, these delimiters are on their own separate lines, although they need not be; it is helpful to identify the blocks of code. Simple commands provide a string substitution within a template line in the command descriptions. The names of the parameters are the names of the fields within the input record or from a list of static parameters which could include the column headings. When the template is expanded by the TEMPLATE ENGINE, also referred to as exploded, the input values and names are allocated or assigned within each template, the format created by the template is preserved, and one of the shells is output.

Block Commands

The block commands are Repeat, Conditional and Expand.

Repeat: The Repeat command repeats the block of text for each record in the input stream. Preferably, nesting of multiple repeat blocks is not allowed because the language and the syntax of the templates are intended to be simple. The repeat command is represented by:

%R
. . . (lines of text)
%r

Conditional: The Condition command will output the contents of a block if the condition is true. Again, preferably, nesting multiple conditional blocks is not recommended. The following expressions are examples of what may be supported in the conditional expression syntax: literal strings: "xxx"; decimal numbers: 1234; Named Parameters; relational operators: =, !=, >, <; prefix/suffix operators (starts with, ends with) ?<, ?, >; boolean operators &|!( ); mathematical expressions like those in the %[expr] command. The syntax of the conditional command is:

%C(condition)
. . . (lines of text)
%c

Expand: The Expand commands expands the lines in the block in the form "for (i=0; i<count; i++)". This is intended for expansion of busses and other "stranded" structures. The count can be either a literal decimal value, a Named Parameter that evaluates to a decimal number, or a mathematical combination of both (like the %[expr] command). Nesting multiple Expand blocks is not recommended. The expand command syntax is:

%E(count)
. . . (lines of text)
%e

Simple Commands

The simple commands are expression, increment/decrement operator, strand, x, z, /. One of skill in the art may add other commands but again the preference is to maintain the language and the templates as simplified and specialized for integrated chip design using hardware descriptive languages. The simple commands are now described.

%[expression] Evaluate: This is a command to evaluate the expression, expression, which may contain one or more Named Parameters and substitute the result into the output. The values of Named Parameters are maintained as strings, but logical and mathematical operations can be performed on Named Parameters if their contents can be successfully converted to decimal integers. Decimal number constants (1234) can also be part of a mathematical expression of this type. The supported mathematical operators are */+−( )^ where ^ is "raised to the power".

%i(op) or %d(op) Iterator: The iterator command substitutes into the output line the current iteration value of an Expand Block. The operator (op) determines the form of the result. (%d is similar to %i but starts at (count-1) and decrements each time the loop is traversed.) The following formats are currently supported:

%i(number) which means to substitute i with at least number characters left padded with zeros, e.g. given %i(3), the number "7" would be represented as 007, and "1280" would be represented as 1280);

%i([) which will substitute i in square brackets, e.g. given %i([), 7 would be represented as [7]);

%i(_) will substitute _I, e.g. given %i(_), 7 would be represented as _7;

%s(count) Strand is a command that provides a strand or bus syntax given a count. The strand produced is of the form "[count-1:0]", e.g. %S(7) returns [7:0]. If count is zero, no strand will be produced and an empty string is outputted in its place. Expressions for count follow the format of the %[expression] command.

%x(string) Exclude for last record Within a repeat block command, the string string will be outputted for all but the last record in the input list. Often this is used in hardware design languages for separator characters, e.g., commas, are not required after the last member in a list.

%z(string) Exclude for last loop: This is the same as %x( ) except it excludes the string on the last iteration of a %E loop.

%/Comment: The comment command ensures that all characters following a %/ up to the end of a line will not appear in the output.

%% Percent Character: This command will produce a single percent character "%" in the output.

Named Parameters preferably do not have the operator character "%&|!=+−/*^ ( )>, and if a Named Parameter ends in _INC and contains an integer value, the value will be incremented each time the Parameter is evaluated.

The language and templates may optionally include implicit formatting. Once the template lines have been expanded, the TEMPLATE ENGINE can be directed to reformat the text to maintain the tab stop positions of the original template if desired. The language and syntax assumes tab stops in the template are evenly spaced, e.g., separated by some number of characters. To reestablish column alignment, the syntax add tabs following the original tabs, or it deletes the original tabs, whichever is necessary. When deleting tabs, the TEMPLATE ENGINE assumes it must always leave at least one tab between the other characters but it can also substitute the proper number of space characters for each tab to make the output "tab-stop independent". To use this formatting effectively, two or more tabs are recommended between columns in the template to allow for significant variation in text length after substitution.

FIG. 7 is a simplified graphical user interface by which a designer may input parameters to include in the corresponding shell, e.g., the timing template will generate the timing shell, the RTL template will generate the RTL shell, and the documentation template will generate the documentation shell. The name of the design module is "Timer" as in an entry field 720; there are six columns: Signal Name 730, Direction 740, Description 750; Input Delay (ns) 760, Output Delay (ns) 770, and Capacitive Load (pf). Note that in accordance with the preferred method of inputting CORRECT DATA ENTRY, there are certain fields that are grayed-out, e.g., shown by lines through the fields or cells 764, 768, 772, 774, 782, 784 so that no data can be entered because the RULES ENGINE maintain that the no entry is required in order to ensure correct data for shell generation. The following is an example of code used by the TEMPLATE ENGINE herein and the resulting generated RTL shell.

| EXAMPLE CODE OF AN RTL TEMPLATE | GENERATED RTL SHELL IS |
|---|---|
| 1 module %[DESIGNMODULE] ( | 1 module TIMER( |
| 2 | 2 |
| 3 %R | 3   INPUT1, |
| 4 %[SIGNALNAME]%x(,) | 4   INPUT2, |
| 5 %r | 5   IOA, |
| 6 | 6   OUTPUTX |
| 7 ); | 7 |
| 8 | 8 |
| 9 %R | 9 |
| 10 %C (DIRECTION = "IN") | 10 input INPUT1; |
| 11 input %[SIGNALNAME]; | 11 input INPUT2; |
| 12 %c | 12 inout IOA; |
| 13 %C (DIRECTION = "INOUT") | 13 output OUTPUTX; |
| 14 inout %[SIGNALNAME]; | 14 |
| 15 %c | 15 timercomponent( |
| 16 %C (DIRECTION = "OUT") | 16   INPUT1   (INPUT1), |
| 17 output %[SIGNALNAME]; | 17   INPUT2   (INPUT2), |
| 18 %c | 18   IOA (IOA), |
| 19 %r | 19   OUTPUTX   (OUTPUTX) |
| 20 | 20   ); |
| 21    timercomponent( | 21 |
| 22 %R | 22 endmodule |
| 23    .%SIGNALNAME   %[SIGNALNAME]) %x (,) | |
| 24 %r | |
| 25    ); | |
| 26 | |
| 27 endmodule | |

Another example is the documentation template in a markup language, the er Interchange Format (MIF), followed by the documentation shell generated by template. A shell could be written in the standard general markup languages ML) such as XML, HTML, PDF, MIF and the resultant shell would be published variety of forms such as web pages on an Intranet or Internet.

| TEMPLATE FOR DOCUMENTATION SHELL | |
|---|---|
| 1 | <MIFFile 5.00> |
| 2 | |
| 3 | <Tbls |
| 4 |   <Tbl |
| 5 |     <TblID 1> |
| 6 |     <TblTag 'Format A'> |
| 7 |     <TblNumColumns 3> |
| 8 |     <TblColumnwidth 1.5., > |
| 9 |     <TblColumnWidth 1.5"> |
| 10 |     <TbiColumnWidth 2.5"> |
| 11 | |
| 12 |     <TblTitle |
| 13 |       <TblTitleContent |

| -continued | |
|---|---|
| TEMPLATE FOR DOCUMENTATION SHELL | |
| 14 |         <Para |
| 15 |           <PgfTag 'TableTitle'> # Forces lookup-in Paragraph Catalog. |
| 16 |           <ParaLine |
| 17 |             <String '10 Signals'> |
| 18 |           ># end of ParaLine |
| 19 |         > # end of Para |
| 20 |       > # end of TblTitleContent |
| 21 |     > # end of TblTitle |
| 22 | |

| -continued | |
|---|---|
| TEMPLATE FOR DOCUMENTATION SHELL | |
| 23 |     <TblH |
| 24 |       <Row |
| 25 | |
| 26 |         <Cell |
| 27 |           <CellContent |
| 28 |             <Para |
| 29 |               <PgfTag 'CellHeading'> |
| 30 |                 ParaLine |
| 31 |                   <String 'Signal name'> |
| 32 | |
| 33 |             > # end of Para |
| 34 |           # end of CellContent |
| 35 |         > # end of Cell |
| 36 | |
| 37 |         <Cell |
| 38 |           <CellContent |
| 39 |             <Para |
| 40 |               <PgfTag 'CellHeading'> |
| 41 |                 <ParaLine |
| 42 |                   <String 'Direction'> |
| 43 |                 > |
| 44 |             > # end of Para |

-continued

TEMPLATE FOR DOCUMENTATION SHELL

```
45        ># end of CellContent
46       > # end of Cell
47
48      <Cell
49        <CellContent
50          <Para
51        <PgfTag 'CellHeading'>
52            <ParaLine
53        <String 'Description'>
54            >
55          ># end of Para
56       > t end of CellContent
57       > # end of Cell
58
59       ># end of Row
60     > # end of TblH
61
62     <TblBody
63 #%R
64       <Row
65
66       <Cell
67         <CellContent
68           <Para
69           <PgfTag
70             <ParaLine
71        <String '%[SIGNALNAME '>
72         >
73          ># end of Para
74       ># end of CellContent
75       ># end of Cell
76
77       <Cell
78          <CellContent
79            <Para
80        <PgfTag 'CellBody'>
81            <ParaLine
82        <String '%[DIRECTION]'>
83        >
84        ># end of Para
85       ># end of CellContent
86        ># end of Cell
87
88       <Cell
89          <CellContent
90            <Para
91        <PgfTag 'CellBody'>
92            <ParaLine
93        <String '%[DESCRIPTION]'>
94        >
95          ># end of Para
96       ># end of CellContent
97        ># end of Cell
98
99       ># end of Row
100
101 # %r
102
103 > # end of TblBody
104 > # end of Tbl
105 > # end of Tbls
106 <TextFlow <Para
107    <PgfTag Body>
108    <ParaLine <ATbl 1>
109    >
110    <ParaLine
111    >
112 >>
```

The documentation shell output from the above documentation template of TEMPLATE ENGINE is given below:

IO Signals

| Signal Name | Direction | Description |
|---|---|---|
| INPUT1 | IN | FIRST INPUT |
| INPUT2 | IN | SECOND INPUT |
| IOA | INOUT | CONTROL PORT |
| OUTPUTX | OUT | RESULT |

An example of code for a template of Timing Analysis is:

```
1   %R
2   %C (DIRECTION = "IN" | DIRECTION = "INOUT")
3   set_input_delay -clock (get-clocks { CLOCK } ] -rise
      %[INPUTDELAY] (get_ports {%[SIGNALNAME]}]
4   set_input_delay -clock {get-clocks { CLOCK } ] -fall
      %[INPUTDELAY] (get_ports {%[SIGNALNAME]}]
5   %c
6
7   %r
8
9   %$R
10  %C (DIRECTION = "OUT" | DIRECTION = "INOUT")
11  set_output_delay-clock (get-clocks { CLOCK } ] -rise
      %[OUTPUTDELAY] (get_ports {%[SIGNALNAME]}]
12  set_output_delay-clock {get-clocks { CLOCK } ] -fall
      %[OUTPUTDELAY] (get_ports {% [SIGNALNAME]}]
13  set_load %[CAPACITANCE] [get_ports {%[SIGNALNAME]}]
14  %c
15
16  %r
```

An example of the output of the TEMPLATE ENGINE for Timing Analysis is a shell as presented herein below:

```
1   set - input - delay _clock [get_clocks { CLOCK } ] -rise 10 [get_ports {INPUT1}]
2   set - input - delay _clock [get_clocks { CLOCK } ] -fall 10 [get_ports {INPUT1}]
3
4   set - input - delay _clock [get_clocks { CLOCK } ] -rise 15 [get_ports {IOA}]
5   set - input - delay _clock [get_clocks { CLOCK } ] -fall 15 [get_ports {IOA}]
6
7
8   set - input - delay _clock [get_clocks { CLOCK } ] -rise 25 [get_ports {IOA}]
9   set - input - delay _clock [get_clocks { CLOCK } ] -fall 25 [get_ports {IOA}]
10  set_load 6 [get_ports {IOA}]
11
12  set - input - delay _clock [get_clocks { CLOCK } ] -rise 5 [get_ports {OUTPUT1}]
13  set - input - delay _clock [get_clocks { CLOCK } ] -fall 5 [get_ports {OUTPUT1}]
14  set_load 3 [get_ports {OUTPUTX}]
15
```

Thus, what has been shown is the use of a new language that can be used in conjunction with existing hardware description languages. Preferably, the template and the languages are used in a TEMPLATE ENGINE as described herein and that TEMPLATE ENGINE is part of a builder tool that automatically manages slice resources and builds RTL code for a memories, I/Os, and clocks of a semiconductor product. The builder tool uses input tables to assign I/Os, clocks, PLLs, and memories.

Use of the tables and definitions of fields found in the tables and some examples will now be presented. A unique input table is not required for the test structures. Tests will be included with the basic components. The TEMPLATE ENGINE can be installed as an application on any client or any server accessible through a network to a client computer. First, a user might select to create a design and then, in the preferred embodiment, a screen of builder tool's selection tables is shown such as in FIG. 8. As is typical in a windows environment, the data files can be opened, saved and shared across a network.

In accordance with an aspect of the invention, the builder tool uses a "Generate" option to create the following shells or design files: preliminary core module netlist file; I/O definition files; user core module blackbox netlist file; an annotated PPPDB file, a RTL file for memory; a RTL shell of the generated module, a file of timing constraints using, e.g., SDC; and exchange files. Exchange files are those that may be involved with converting data and maintaining compatibility of data across the various tools.

Either as or after the data file has been retrieved, a user may select an operation such as to create the shells or other design files. In some embodiments, it may be necessary to specify the location for each design file. Alternatively the paths and file names of the data may be overridden either automatically or by the user and the data from the data files are inserted into the TEMPLATE ENGINE. The TEMPLATE ENGINE explodes the templates with data from the data file/base, i.e., the appropriate specifications of the user and the application set are allocated to each template when it is invoked. The user becomes aware of which shells or other design files were generated, or alternatively appropriate error information where a shell or other design file fails to generate. After generating design files, the design database to keep the created file paths can be saved.

In fact, as earlier discussed, the top module can be completely generated using the builder tool as described in the patent application referred herein and the TEMPLATE ENGINE. Logical memories and clocks can be added and/or deleted. To add a logical memory, the designer may click the Memories and select Add on a menu bar of some graphical user interface, as is known in the art. In one embodiment, a new row will be added to a memory specifications table. Logical memory may be deleted as follows: first, highlight any cell(s) in one or more rows from some menu or other way a computer is known to receive data and select Delete. The memory has been deleted from the Memory Specifications Table. Of course, more than one memory at a time by highlighting cells in multiple rows for the memories you want to delete. To add a clock, invoke the appropriate user interface and call a Clocks menu and select Add which adds a new row is added to the Clock Specifications Table. Clocks can be deleted from a Clock Specifications Table.

Bus declarations may be entered easily using the builder tool. A bus is a group of input/output ports that share a common signal name. An bus can be declared by specifying a signal name having an individual bit in square brackets representing a starting index, for example, bus_name[5_____]. A user could simply highlight a range of ports, assign a common base name, and then from a starting index, a user could simply increment or decrement the ports on that bus. Optionally, a user can manually change each port or use other copy/paste techniques. In one embodiment of the TEMPLATE ENGINE, one bit buses are not allowed; indices are contiguous, and the least significant bit is zero.

A screen shot of a resource viewer is shown in FIG. 9. The resource viewer may list the technology and the name of the semiconductor platform. The technology of the chip, typically referring the gate length of the transistors, may be presented at 1302, and the name slice at 1304. The resource viewer 1300 has several windows which list the I/O resources available for development 1306, the PLL resources available for development 1324, the I/O resources of the coreware, i.e., the hardmacs and/or logical functions that are available for design, instantiated, and ready for use 1334, and the memory resources 1344. Each of these windows may have a pull-down window, hypertext links, or other known method to expand the view into the windows for a more complete lists of the factors and parameters affecting a particular resource. For I/O resources 1306, the resource viewer 1300 may display how many signal I/Os have been used, and how many are available. For phase locked loops (PLLs)1324, hardmacs 1334, and diffused memories 1344, the resource viewer 1300 may display if a specific component is used or unused, the type of component, and the physical reference, e.g., 1330, 1354. For logical memories to be configured from the transistor fabric, the resource viewer may display how much transistor fabric has been used 1346 and how much is available 1348.

A package viewer may or may not be included; a package viewer presents a graphical view of the package ball layout. As you pass your cursor over the layout, flyover help text indicates the package ball signal name and its use. The package balls are also color coded to provide additional information about each package ball. Crossprobing is also available between the package viewer and the I/O specifications table.

Below is a list of parameters that can be incorporated into a table. Any table, its size, the order of the columns in the table, and the content of table cells can be edited or retained. In the table, there may be some cells that are highlighted or otherwise set apart to indicate an automatically generated value so a person could update the data in these cells. Remove the highlighting by putting a new value in the cell by pasting or typing text. To change the size of a table, click and drag the bar between the tables until the table is the desired size. A user is able to change the column order and to change the order within a column. Column width can be changed using a drop and drag or another technique. Columns may also be hidden and restored, but in some embodiments, a user may not hide index columns. To change the order in which the columns are sorted, a user simply clicks on a column heading. Each column maybe sorted in one of several ways: numeric, alphanumeric, i.e., first alphabetical then numerical, fixed list, and an enumerated list, etc.

| Column Heading | Numeric | Alphanumeric | Fixed List | Enumerated |
|---|---|---|---|---|
| I/O Specification Table | | | | |
| Bump | x | | | |
| Package Ball | | x | | |
| Side | | | | x |
| Diff Pair | x | | | |
| Power Plane | | | x | |
| Segment | | | x | |
| Signal Name | | | | |

| Column Heading | Numeric | Alphanumeric | Fixed List | Enumerated |
|---|---|---|---|---|
| (Bond Out) | | | | |
| Signal Name (Platform) | | x | | |
| Signal Name (User) | | x | | |
| Diffused I/O Type | | | | x |
| I/O Direction | | | | x |
| VREF or BZgrp (Platform) | | | x | |
| VREF or BZgrp (User) | | | x | |
| I/O Use (Platform) | | | | x |
| I/O Use (User) | | | | x |
| Config I/O Type (Platform) | | | | x |
| Config I/O Type (User) | | | | x |
| Component Type (Platform) | | | | x |
| Component Name (Platform) | | | | x |
| Component Port (Platform) | | | | x |
| Component Type (User) | | | | x |
| Component Name (User) | | | | x |
| Component Port (User) | | | | x |
| Test Usage (Platform) | | | | x |
| Test Info. (Platform) | | x | | |
| Description | | x | | |
| Note | | x | | |
| Setup Time | x | | | |
| Capture Clock | | | | x |
| Output Time | x | | | |
| Sourcing Clock | | | | x |
| Cap Load | x | | | |
| Memory Specifications Table | | | | |
| Memory Name | | x | | |
| R-Cell Only | | | | x |
| Memory Ports | | x | | |
| Words | x | | | |
| Bits | x | | | |
| Physical References | | x | | |
| PLL Specifications Table | | | | |
| PLL Name | | x | | |
| PLL Type | | x | | |
| Physical Reference | | x | | |
| Output Frequency | x | | | |
| Feedback Divider | | | | x |
| Reference Frequency | x | | | |
| Clock Specifications Table | | | | |
| Clock Name | | x | | |
| Clock Mode | | | | x |
| Frequency | x | | | |
| Divider | | | | x |
| Alt Clk | | | x | |
| Osc. Source Type | | | | x |
| Osc. Source Name | | x | | |
| Osc Source Frequency | x | | | |
| Reset Source Name | | x | | |

The TEMPLATE ENGINE embodies a stable sort for sorting multiple columns which means that all the same values maintain their relative order in the table. For example, FIG. 10 shows that first the Power Plane column is sorted and, in doing so all Signal02s are grouped together. Next, the Segment column is sorting and in doing so, each different segment is grouped together, e.g., all the I/Os in Segment50 are grouped together. If you look at the Signal column, all of the I/Os in Power Plane Signal02 that are in Segment50 remained grouped together. FIG. 11 shows an example of what this sort looks like.

Editing cells and/or the content of certain cells maybe accomplished by the cut, copy, and paste techniques except that cutting is only allowed in cells that are not grayed-out and text fields that allow the cell to remain blank. Similarly, a history of any edits is captured to allow a user to undo and redo operations. Grouped operations are considered a single edit operation, for example, a bus paste operation is one edit. In one embodiment, however, a user may not undo clock and memory add and delete operations because these operations clear the undo/redo history. One of the group operations supports incrementing or decrementing from a starting index and is called a "bus paste" used to create buses in the builder tool. FIGS. 12 and 13 provide a screen shot of instructions of how to accomplish and the completed "bus paste" operation, respectively. Entries in the specifications table can easily be located, modified, and/or replaced with the "find and replace" operation. FIG. 14 is a screen shot of a "find and replace" operation. A user may edit the contents of a cell by selecting a cell to edit, then one of two things will happen; a drop-down list or a cursor will appear. If the drop-down list appears, then one of the options from the list may be selected; otherwise if a cursor appears, the desired value(s) can be entered. There may be columns labeled Platform that are not editable by a user but contain information about the given platform application set from which the semiconductor product will be created User columns, however, can accept data entry and/or modification.

Included below is a list of parameters that might be input by the RULES ENGINE or the TEMPLATE ENGINE, in one or more specification tables for, e.g., I/Os, clocks, memories, PLLs. This list is intended to be neither exhaustive nor limitative but merely provides examples of the power of the TEMPLATE ENGINE and the RULES ENGINE. The reference numbers refer to a specific block in FIGS. 6, 7A, 7B, 8, 9, and 9B of the RULES ENGINE.

| | |
|---|---|
| Bump 904 | The location of the 1/0 on the silicon die. |
| Package Ball 906 | The physical location on the package where a signal will be located. |
| Side 1202 | The side of the die where the signal is located. Possible values are: LEFT, RIGHT, TOP or BOTTOM. |
| Diff Pair 1204 | The matching bump to make up a differential pair. |
| Power Plane 1206 | This field indicates how the bump is used. Possible values are: Power, Signal, Ground-, SignalPower, or SignalGround. |
| Segment | Segment Region of the power plane that the signal passes through. |
| Signal Name | Name of the signal associated with the package location. The name chosen |

-continued

| | |
|---|---|
| (Platform) 1020 | must comply with all signal name naming conventions. Refer to Naming Conventions. |
| Signal Name (User) 1024 | Name of the signal associated with the package location. You must choose a name that complies with all signal naming conventions. Refer to Naming Conventions. |
| Diffused I/O Type 940 | This field indicates the type of I/O buffer that is diffused onto the slice. Diffused I/O buffers can be configured or fixed. |
| I/O Direction 1050 | This field indicates the maximum capability of the I/O buffer. Possible values for this field are: IN, OUT, INOUT, or blank. |
| VREF or Bzgrp 910 (Platform) | If the buffer type require a VREF, this field identifies the signal name used as a voltage reference for the I/O buffer. If the buffer type is BZ I/O, this field indicates the EN Update Block that controls this buffer. |
| VREF or BZgrp (User) 920 | If the buffer type requires a VREF, this field identifies the signal name used as a voltage reference for the I/O buffer. If the buffer type is BZ I/O, this field indicates the EN Update Block that controls this buffer. |
| I/O Use (Platform) 1054 | This field indicates the direction of the I/O. It will automatically be filled in if the I/O Direction is IN, OUT, or blank. If the I/O direction is INOUT, possible values are IN, OUT, INOUT, or blank. |
| I/O Use (User) 1058 | This field indicates the direction of the I/O. It will automatically be filled in if the I/O Direction is IN, OUT, or blank. If the I/O direction is INOUT. possible values are: IN, OUT, INOUT, or blank. |
| Configurable I/O Type (Platform) 950 | This field indicates what type of configurable I/O buffer is being used. |
| Configurable I/O Type (User) 1040 | This field indicates what type of configurable I/O buffer is being used. |
| Component Type 960 (Platform) | Type of component to which the signal is being routed. The possible values are: None, PLL, GigaBlaze core, HyperPhy core, DDR, and UCM. |
| Component Name 970 (Platform) | The name of the component to which that signal will connect. A drop-down list is generated for each component type. |
| Component Port 1060 (Platform) | Name of the port on the component to which that signal connects. A drop-down list is generated that is dependent on the component type and name. |
| Component Type (User) 990 | Type of component to which the signal is being routed. The possible values for component types are based on what Component Type (Plafform) was chosen |
| Component Name (User) 1010 | The name of the component to which the signal will connect. |
| Component Port (User) 1070 | Name of the port on the component to which the signal connects. |
| Test Usage (Platform) 1066 | This field states if the signal is to be used for test purposes. Possible values are: No Test, Dedicated, Shared and Reserved. |
| Description 1210 | Used to enter additional description about the primary I/O. |
| Note 1212 | Use this field to add any additional information about the primary I/O. |
| Setup Time (ns) | A requirement specifying the minimum time in nanoseconds that the data must be stable on the pin prior to the capturing clock edge. |
| Capture Clock | The name of the clock used to capture data on input ports. A drop-down list is generated from the list of all clocks defined in the Clock Specifications Table. |
| Output Time (ns) | A requirement specifying maximum time in nanoseconds between the sourcing clock edge and the point at which the data will be stable. |
| Sourcing Clock | The name of the clock used to launch data on output ports. A drop-down list is generated from the list of all clocks defined in the Clock Specifications Table. |
| Cap Load (pF) | The amount of capacitive load on the I/O buffer. |
| Clock Name 720 | The name of the clock component. This must be a unique name. Refer to the Naming Conventions section. |
| Clock Mode 740 | The mode of clock output for a clock factory element. This defines how many outputs the clock factory element needs. Possible values are: Nominal, Nominal Early, Nominal Late, or Nominal Early Late. |
| Frequency 780 | This field is computed. The value of this field is the result of the value in the Oscillator Source Frequency field divided by the value in the Divider field. |
| Osc Source Frequency Divider 730 | The divider for the Oscillator Source Frequency. Alternate Clock Creates a clock with a multiple selection source |
| Osc Source Type 770 | The oscillator source for the clock component. Possible values are: Primary I/O, PLL, or Recovered Clock. |
| Osc Source Name 750 | The logical name of the oscillator source. If the Oscillator Source Type is Primary I/O, then this field is the name of a primary I/O. If the Oscillator Source Type is Recovered Clock, then this field is the name of a UCM port. If the Oscillator Source Type is PLL, then this field is the name of a PLL. |
| Osc Source Frequency 760 | The frequency of the oscillator source. |
| Reset Source Name 790 | The name of the reset source for the clock component. If the name does not match any primary I/O name, then a UCM port is created with the Reset Source Name. |
| PLL Name 602 | The logical name for the PLL component. Each PLL component must have a unique name. |

-continued

| | |
|---|---|
| PLL Type 630 | The type of PLL component. |
| Physical Reference 632 | Reference location to a unique PLL on the slice. |
| Output Frequency 614 | The output frequency of the PLL. This value is determined from the Feedback Divider and Reference Frequency. |
| Feedback Divider 624 | The divider for the Reference Frequency. |
| Reference Frequency 626 | Used to derive the output frequency. This is required to achieve the Output Frequency. |
| Memory Name 820 | The logical name for the memory component. Each memory component must have a unique name. Refer to Naming Conventions. |
| R-Cell Only 840 | A value that indicates if the logical memory component should be created from R-Cell only or if the tool should choose between R-Cell and diffused elements. A value of True, forces the tool to create a memory logical component from R-Cells. A value of False, allows the tool to choose between diffused and R-Cells when creating a logical memory component. This field can only contain a true or false value. |
| Memory Ports 874 | The number of ports for the logical memory component. Possible values are: 1 read-write, 2 read_write, and 1 read and 1 write. |
| Number of Words 830 | The number of words for the logical memory component. The number of words defines the depth of the memory. |
| Number of Bits 850 | The number of bits for the logical memory component. The number of bits defines the width of the memory. |
| Frequency (MHz) 880 | The desired frequency of memory. |
| Pipeline Stages. 890 | Defines how flip-flops will be placed in memory access paths to assist in timing. Possible values are: Flop In, Flop Out, Both, or None |
| Error Protection 876 | This field indicates if error protection logic should be built and the memory size adjusted accordingly for the logical memory component. Possible values for this field are ECC, Parity, or None. |
| Physical Reference(s) 860 | Specifies the exact Diffused Memory Element(s) to use when constructing a logical memory. This field does not apply if the memory component is built using R-Cells. For diffused memories, if the user does not select a physical reference, the tool selects one. |

An example of how to use a partially completed I/O table is shown with FIGS. 15-18. Each row in this table represents a unique port. Viewing FIG. 15, one of the higher level functions available in the menu allows a user to change the voltage level of a power segment wherein a user is able to change the voltage level of a power segment with a single operation so long as all of the buffers used on that power segment have an equivalent at the target voltage level. FIG. 15 is a screen shot of the graphical user interface to change the voltage level of a power segment. FIG. 16 is a screen shot of an I/O signal that has not been edited, and FIG. 17 is a screen shot of a partially edited I/O input table. To edit a partially completed I/O table, first find the signal to be edited in a row of the table and then change the name in the Signal Name (User) column if needed. Under the Config IO Type (user) column, select the cell you want to configure and either select an appropriate I/O buffer from the drop-down list or enter one preferably in accordance with CORRECT DATA ENTRY. The buffer preferably should be the same voltage level as all other buffers on the same power segment, i.e., the buffer name indicates the voltage level of the buffer. For bidirectional buffers (INOUT), select how the I/O is going to be used in the I/O Use (User) column. Under the Component Type (User) column, select the User Module option from the drop-down list which may appear in the cell. In accordance with the RULES ENGINE, if a user attempts to enter an illegal connection, an error dialog box will appear and the attempted modification may be ignored. FIG. 18 is a screen shot of a completed I/O Configuration.

In a Clock Specifications Table of FIG. 19, a user may configure a clock from a PLL by first adding a clock to the table and in the Osc Source Type column, select or entering a PLL. In the Osc Source Name column, the user is requested to change the name to the desired PLL and, if desired, to change the clock name in the Clock Name field. The value in the Divider column is changed and will automatically change the clock frequency. Then the reset source is set; if the user wants the reset to come from a primary I/O, she/he is requested to enter the name from the Signal Name (User) column into the Reset Source column. FIG. 19 is a screen shot of a graphical user interface showing a user-configured clock.

There may be restrictions on what characters can be used in a particular shell, e.g., an RTL shell may comply with VERILOG naming conventions. Below are only examples of some naming conventions intended as examples only and not limitative. There are three different naming conventions: (1) signal and component names; (2) floating point; and (3) integer. The signal and component names support the following characters: capital and lower case A-Z, numbers 0-9, underscore (_), and brackets ([and ]) and in one embodiment, the name cannot start with a number, underscore (_), or brackets ([and]); there are no multiple underscores in a row (___); only numbers are allowed between brackets, e.g., for example, [526]; and test signals may have a unique prefix. Signal and bus names cannot end in a "_". For buses, this means that "_[" is not allowed. Floating point numbers cannot contain exponential notations and may represent any number must be less than 1 million (1,000,000). Integers must be numeric (0-9) and may have a maximum number of digits. The table below provides examples of the fields and their related naming conventions.

| Field | Signal Name Base | Floating Point | Integer |
|---|---|---|---|
| Signal Name (Bond Out) | x | | |
| Signal Name (Platform) | x | | |
| Signal Name (User) | x | | |
| VREF or BZgrp (Platform) | x | | |

-continued

| Field | Signal Name Base | Floating Point | Integer |
|---|---|---|---|
| VREF or BZgrp (User) | x | | |
| Setup Time | | x | |
| Output Time | | x | |
| Cap Load | | | x |
| Memory Name | x | | |
| Words | | | x |
| Bits | | | x |
| Frequency | | x | |
| PLL Name | x | | |
| Output Frequency | | x | |
| Clock Name | x | | |
| Alternate Clock | x | | |
| Osc. Source Name | x | | |
| Osc. Source Frequency | | x | |
| Reset Source | x | | |

While the description provides embodiments of the invention, the embodiments are considered illustrative and by way of example only and are not intended to be limitative. Rather, the invention is as claimed is.

What is claimed is:

1. A method of designing a semiconductor product, comprising:
    (a) reading a plurality of resources available on an application set, the application set comprising a semiconductor platform and its description;
    (b) reading a user's specification intended to be developed from the application set;
    (c) allocating at least one resource to the user's specification;
    (d) accepting and propagating the allocation through a template engine including templates for a plurality of specification tables and at least one shell; and
    (e) generating the at least one shell and the specification tables from the templates.

2. The method of claim 1, wherein the at least one shell comprises one or more of the following: an RTL shell, a timing shell, a documentation shell, a manufacturing test shell, a synthesis shell, and a floorplan shell.

3. The method of claim 2, wherein some of the plurality of resources and/or the user's specifications pertain to phase locked loops for use in the semiconductor product.

4. The method of claim 3, wherein the plurality of parameters pertaining to allocation and propagation of one or more phase locked loops comprises:
    (a) name and index;
    (b) output frequency, feedback divider, and reference frequency;
    (c) type of PLL; and
    (d) physical reference.

5. The method of claim 2, wherein some of the plurality of resources and/or the user's specifications pertain to clocks for use in the semiconductor product.

6. The method of claim 5, wherein the plurality of parameters pertaining to allocation and propagation of one or more clocks comprises:
    (a) name and index;
    (b) a name, frequency, and type of an oscillator source for each clock;
    (c) divider, if any, and frequency of each clock;
    (d) alternate clock; and
    (e) a reset source name of each clock.

7. The method of claim 2, wherein some of the plurality of resources and/or the user's specifications pertain to memories for use in the semiconductor product.

8. The method of claim 7, wherein the plurality of parameters pertaining to allocation and propagation of one or more memories comprises:
    (a) name and index of each memory;
    (b) a number of words and a number of bits (depth and width) of each memory;
    (c) whether the memory is constructed from transistor fabric or is a hardmac resource of the application set;
    (d) the number of memory ports of each memory; and
    (e) physical reference of each memory.

9. The method of claim 2, wherein some of the plurality of resources and/or the user's specifications pertain to input/output (110) components and signals for use in the semiconductor product.

10. The method of claim 9, wherein the plurality of parameters pertaining to allocation and propagation of one or more 110 components and signals comprises:
    (a) a signal name and index;
    (b) a reference voltage for each 110 signal;
    (c) a direction and use of each 110 signal;
    (d) a power plane and location of each 110 signal;
    (e) type of 110; and
    (f) use of each 110 signal in testing of the semiconductor product; and
    (g) source and destination and port numbers of each 110 signal.

11. The method of claim 1, further comprising the step of:
    (a) determining that one of the plurality of resources cannot be allocated to the user's specification;
    (b) generating an error message; and/or
    (c) not accepting the allocation of the resource to the userts specification.

* * * * *